United States Patent
Saxler et al.

(10) Patent No.: US 9,224,596 B2
(45) Date of Patent: Dec. 29, 2015

(54) METHODS OF FABRICATING THICK SEMI-INSULATING OR INSULATING EPITAXIAL GALLIUM NITRIDE LAYERS

(71) Applicant: Cree, Inc., Durham, NC (US)

(72) Inventors: Adam William Saxler, Boise, ID (US); Yifeng Wu, Goleta, CA (US); Primit Parikh, Goleta, CA (US); Umesh Mishra, Santa Barbara, CA (US); Richard Peter Smith, Santa Barbara, CA (US); Scott T. Sheppard, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/975,491

(22) Filed: Aug. 26, 2013

(65) Prior Publication Data
US 2013/0344687 A1    Dec. 26, 2013

Related U.S. Application Data

(62) Division of application No. 11/103,117, filed on Apr. 11, 2005, now Pat. No. 8,575,651.

(51) Int. Cl.
*H01L 21/20* (2006.01)
*H01L 21/28* (2006.01)
(Continued)

(52) U.S. Cl.
CPC ........ *H01L 21/0254* (2013.01); *H01L 21/0237* (2013.01); *H01L 21/0262* (2013.01);
(Continued)

(58) Field of Classification Search
CPC .............. H01L 29/2003; H01L 29/66462; H01L 21/02458; H01L 29/66431; H01L 29/1608; H01L 33/007; H01L 33/0075; H01L 21/02447
See application file for complete search history.

(56) References Cited

U.S. PATENT DOCUMENTS

| 4,424,525 A | 1/1984 | Mimura |
| 4,471,366 A | 9/1984 | Delagebeaudeuf et al. |

(Continued)

FOREIGN PATENT DOCUMENTS

| EP | 0 334 006 A1 | 9/1989 |
| EP | 0 563 847 A2 | 10/1993 |

(Continued)

OTHER PUBLICATIONS

Ambacher et al., "Two Dimensional Electron Gases Induced by Spontaneous and Piezoelectric Polarization Charges in N- and Ga-face AlGaN/GaN Heterostructures," *Journal of Applied Physics*. vol. 85, No. 6, pp. 3222-3233 (Mar. 1999).

(Continued)

*Primary Examiner* — Bac Au
(74) *Attorney, Agent, or Firm* — Myers Bigel Sibley & Sajovec

(57) ABSTRACT

Semiconductor device structures and methods of fabricating semiconductor devices structures are provided that include a semi-insulating or insulating GaN epitaxial layer on a conductive semiconductor substrate and/or a conductive layer. The semi-insulating or insulating GaN epitaxial layer has a thickness of at least about 4 μm. GaN semiconductor device structures and methods of fabricating GaN semiconductor device structures are also provided that include an electrically conductive SiC substrate and an insulating or semi-insulating GaN epitaxial layer on the conductive SiC substrate. The GaN epitaxial layer has a thickness of at least about 4 μm. GaN semiconductor device structures and methods of fabricating GaN semiconductor device structures are also provided that include an electrically conductive GaN substrate, an insulating or semi-insulating GaN epitaxial layer on the conductive GaN substrate, a GaN based semiconductor device on the GaN epitaxial layer and a via hole and corresponding via metal in the via hole that extends through layers of the GaN based semiconductor device and the GaN epitaxial layer.

29 Claims, 6 Drawing Sheets

(51) Int. Cl.
*H01L 21/36* (2006.01)
*H01L 21/02* (2006.01)
*H01L 29/417* (2006.01)
*H01L 29/66* (2006.01)
*H01L 29/778* (2006.01)
*H01L 29/16* (2006.01)
*H01L 29/20* (2006.01)

(52) U.S. Cl.
CPC .... *H01L21/02425* (2013.01); *H01L 21/02439* (2013.01); *H01L 21/02491* (2013.01); *H01L 21/02581* (2013.01); *H01L 29/4175* (2013.01); *H01L 29/41766* (2013.01); *H01L 29/66462* (2013.01); *H01L 29/7787* (2013.01); *H01L 29/1608* (2013.01); *H01L 29/2003* (2013.01)

(56) References Cited

U.S. PATENT DOCUMENTS

| | | | |
|---|---|---|---|
| 4,727,403 A | 2/1988 | Hida et al. | |
| 4,755,867 A | 7/1988 | Cheng | |
| 4,788,156 A | 11/1988 | Stoneham et al. | |
| 4,946,547 A | 8/1990 | Palmour et al. | |
| 5,053,348 A | 10/1991 | Mishra et al. | |
| 5,172,197 A | 12/1992 | Nguyen et al. | |
| 5,192,987 A | 3/1993 | Khan et al. | |
| 5,200,022 A | 4/1993 | Kong et al. | |
| 5,210,051 A | 5/1993 | Carter, Jr. | |
| 5,296,395 A | 3/1994 | Khan et al. | |
| 5,298,445 A | 3/1994 | Asano | |
| 5,362,678 A | 11/1994 | Komaru et al. | |
| RE34,861 E | 2/1995 | Davis et al. | |
| 5,389,571 A | 2/1995 | Takeuchi et al. | |
| 5,393,993 A | 2/1995 | Edmond et al. | |
| 5,523,589 A | 6/1996 | Edmond et al. | |
| 5,534,462 A | 7/1996 | Fiordalice et al. | |
| 5,592,501 A | 1/1997 | Edmond et al. | |
| 5,686,737 A | 11/1997 | Allen | |
| 5,700,714 A | 12/1997 | Ogilhara et al. | |
| 5,701,019 A | 12/1997 | Matsumoto et al. | |
| 5,705,827 A | 1/1998 | Baba et al. | |
| 5,804,482 A | 9/1998 | Konstantinov et al. | |
| 5,885,860 A | 3/1999 | Weitzel et al. | |
| 5,946,547 A | 8/1999 | Kim et al. | |
| 5,990,531 A | 11/1999 | Taskar et al. | |
| 6,028,328 A | 2/2000 | Riechert et al. | |
| 6,046,464 A | 4/2000 | Schetzina | |
| 6,051,849 A | 4/2000 | Davis et al. | |
| 6,064,082 A | 5/2000 | Kawai et al. | |
| 6,086,673 A | 7/2000 | Molnar | |
| 6,150,680 A | 11/2000 | Eastman et al. | |
| 6,177,685 B1 | 1/2001 | Teraguchi et al. | |
| 6,177,688 B1 | 1/2001 | Linthicum et al. | |
| 6,218,680 B1 | 4/2001 | Carter, Jr. et al. | |
| 6,255,198 B1 | 7/2001 | Linthicum et al. | |
| 6,261,929 B1 | 7/2001 | Gehrke et al. | |
| 6,316,793 B1 | 11/2001 | Sheppard et al. | |
| 6,376,339 B2 | 4/2002 | Linthicum et al. | |
| 6,380,108 B1 | 4/2002 | Linthicum et al. | |
| 6,396,085 B1 | 5/2002 | Yoshida | |
| 6,429,467 B1 | 8/2002 | Ando | |
| 6,448,648 B1 | 9/2002 | Boos | |
| 6,462,355 B1 | 10/2002 | Linthicum et al. | |
| 6,476,431 B1 | 11/2002 | Ohno et al. | |
| 6,486,042 B2 | 11/2002 | Gehrke et al. | |
| 6,489,221 B2 | 12/2002 | Gehrke et al. | |
| 6,492,669 B2 | 12/2002 | Nakayama et al. | |
| 6,515,316 B1 | 2/2003 | Wojtowicz et al. | |
| 6,521,514 B1 | 2/2003 | Gehrke et al. | |
| 6,533,874 B1 * | 3/2003 | Vaudo et al. | 148/33.5 |
| 6,545,300 B2 | 4/2003 | Gehrke et al. | |
| 6,548,333 B2 | 4/2003 | Smith | |
| 6,570,192 B1 | 5/2003 | Davis et al. | |
| 6,582,906 B1 | 6/2003 | Cao et al. | |
| 6,582,986 B2 | 6/2003 | Kong et al. | |
| 6,586,778 B2 | 7/2003 | Linthicum et al. | |
| 6,586,781 B2 | 7/2003 | Wu et al. | |
| 6,602,763 B2 | 8/2003 | Davis et al. | |
| 6,602,764 B2 | 8/2003 | Linthicum et al. | |
| 6,608,327 B1 | 8/2003 | Davis et al. | |
| 6,621,148 B2 | 9/2003 | Linthicum et al. | |
| 6,639,255 B2 | 10/2003 | Inoue et al. | |
| 6,686,261 B2 | 2/2004 | Gehrke et al. | |
| 6,706,114 B2 | 3/2004 | Mueller | |
| 6,765,240 B2 | 7/2004 | Tischler et al. | |
| 6,841,001 B2 | 1/2005 | Saxler | 117/84 |
| 6,849,882 B2 | 2/2005 | Chavarkar et al. | |
| 2001/0015446 A1 | 8/2001 | Inoue et al. | |
| 2001/0020700 A1 | 9/2001 | Inoue et al. | |
| 2001/0023964 A1 | 9/2001 | Wu et al. | |
| 2001/0040246 A1 | 11/2001 | Ishii | |
| 2002/0008241 A1 | 1/2002 | Edmond et al. | |
| 2002/0017648 A1 | 2/2002 | Kasahara et al. | |
| 2002/0017696 A1 | 2/2002 | Nakayama et al. | |
| 2002/0066908 A1 | 6/2002 | Smith | |
| 2002/0079508 A1 | 6/2002 | Yoshida | |
| 2002/0119610 A1 | 8/2002 | Nishii et al. | |
| 2002/0125506 A1 | 9/2002 | Yoshida et al. | |
| 2002/0167023 A1 | 11/2002 | Charvarkar et al. | |
| 2003/0017683 A1 | 1/2003 | Emrick et al. | |
| 2003/0020092 A1 | 1/2003 | Parikh et al. | |
| 2003/0102482 A1 | 6/2003 | Saxler | |
| 2003/0123829 A1 | 7/2003 | Taylor | |
| 2003/0145784 A1 | 8/2003 | Thompson et al. | |
| 2003/0157776 A1 | 8/2003 | Smith | |
| 2003/0213975 A1 | 11/2003 | Hirose et al. | |
| 2004/0004223 A1 | 1/2004 | Nagahama et al. | |
| 2004/0021152 A1 | 2/2004 | Nguyen et al. | |
| 2004/0029330 A1 | 2/2004 | Hussain et al. | |
| 2004/0061129 A1 | 4/2004 | Saxler et al. | |
| 2004/0149993 A1 | 8/2004 | McClure et al. | |
| 2004/0241970 A1 | 12/2004 | Ring | |
| 2005/0001235 A1 | 1/2005 | Murata et al. | 257/192 |
| 2005/0029526 A1 | 2/2005 | McClure et al. | |
| 2005/0087753 A1 | 4/2005 | D'Evelyn et al. | 257/98 |
| 2005/0104083 A1 * | 5/2005 | Bader et al. | 257/103 |

FOREIGN PATENT DOCUMENTS

| | | |
|---|---|---|
| JP | 61-187371 A | 8/1986 |
| JP | 4280456 A | 10/1992 |
| JP | 10-050982 | 2/1998 |
| JP | 11-186287 A | 7/1999 |
| JP | 11261053 | 9/1999 |
| JP | 2000-150538 A | 5/2000 |
| JP | 2001-189322 A | 7/2001 |
| JP | 2001230407 A | 8/2001 |
| JP | 2001-308108 A | 11/2001 |
| JP | 2002016087 A | 1/2002 |
| JP | 2004-342810 | 12/2004 |
| JP | 2004-363563 A | 12/2004 |
| KR | 2004186558 A | 7/2004 |
| WO | WO 93/23877 A1 | 11/1993 |
| WO | WO 01/57929 A1 | 8/2001 |
| WO | WO 03/049193 A1 | 6/2003 |
| WO | WO 2004/008495 | 1/2004 |
| WO | WO 2004/061923 A1 | 7/2004 |
| WO | WO 2004/097941 A1 | 11/2004 |
| WO | WO 2005/008738 A2 | 1/2005 |

OTHER PUBLICATIONS

Ando et al., "10-W/mm AlGaN—GaN HFET With a Field Modulating Plate," *IEEE Electron Device Letters*, 24(5), pp. 289-291 (May 2003).

Asbeck et al. "Piezoelectric charge densities in AlGaN/GaN HFETs," *Elecronics Letters*. vol. 33, No. 14, pp. 1230-1231 (1997).

Beaumont, B. et al., "Epitaxial Lateral Overgrowth of GaN," *Phys. Stat. Sol.*-(b) 227, No. 1, pp. 1-43 (2001).

Ben-Yaacov et al., "AlGaN/GaN Current Aperture Vertical Electron Transistors with Regrown Channels," *Journal of Applied Physics*. vol. 95, No. 4, pp. 2073-2078 (2004).

(56) References Cited

OTHER PUBLICATIONS

Breitschadel et al. "Minimization of Leakage Current of Recessed Gate AlGaN/GaN HEMTs by Optimizing the Dry-Etching Process," *Journal of Electronic Materials*. vol. 28, No. 12, pp. 1420-1423 (1999).
Burm et al. "Recessed Gate GaN MODFETs" *Solid-State Electronics*. vol. 41, No. 2, pp. 247-250 (1997).
Burm et al. "Ultra-Low Resistive Ohmic Contacts on n-GaN Using Si Implantation," *Applied Physics Letters*. vol. 70, No. 4, 464-66 (1997).
Chang et al., "AlGaN/GaN Modulation-Doped Field-Effect Transistors with an Mg-doped Carrier Confinement Layer," *Jpn. J. Appl. Phys.*, 42:3316-3319 (2003).
Chen et al. "Cl2 reactive ion etching for gate recessing of AlGaN/GaN field-effect transistors," *J. Vac. Sci. Technol. B*. vol. 17, No. 6, pp. 2755-2758 (1999).
Chini et al., "Power and Linearity Characteristics of Field-Plagted Recessed-Gate AlGaN—GaN HEMTs," *IEEE Electron Device Letters*, 25(5), pp. 229-231 (May 2004).
Cho et al., "A New GaAs Field Effect Transistor (FET) with Dipole Barrier (DIB)," *Jpn. J. Appl. Phys.* 33:775-778 (1994).
Coffie et al., Unpassivated p-GaN/AlGaN/GaN HEMTs with 7.1 W/MMF at 10 GHz, *Electronic Letters online No. 20030872*, 39(19), (Sep. 18, 2003).
Eastman et al. "GaN materials for high power microwave amplifiers," *Mat. Res. Soc. Symp. Proc.* —vol. 512 (1998).
Eastman et al. "Undoped AlGaN/GaN HEMTs for Microwave Power Amplification," *IEEE Transactions on Electron Devices*. vol. 48, No. 3, pp. 479-485 (Mar. 2001).
Egawa et al. "Recessed gate ALGaN/GaN MODFET on Sapphire Grown by MOCVD," *Applied Physics Letters*. vol. 76, No. 1, pp. 121-123 (Jan. 2000).
Gaska et al. "Electron Transport in AlGaN/GaN Heterostructures Grown on 6H-SIC Substrates," *Applied Physics Letters*. vol. 72, No. 6, pp. 707-709 (Feb. 1998).
Gaska et al. "High-Temperature Performance of AlGaN/GaN HFET's on SiC Substrates," *IEEE Electron Device Letters*. vol. 18, No. 1, pp. 492-494 (Oct. 1997).
Gaska et al., "Self-Heating in High-Power AlGaN/GaN HFET's," *IEEE Electron Device Letters*, 19(3), pp. 89-91 (Mar. 1998).
Gelmont et al. "Monte Carlo simulation of electron transport in gallium nitride," *Journal of Applied Physics*. vol. 74, No. 3, pp. 1818-1821 (Aug. 1993).
Heikman et al., "Growth of Fe-Doped Semi-insulating GaN by Metalorganic Chemical Vapor Deposition," *Applied Physics Letters*. vol. 83, No. 1, pp. 439-441 (Jul. 2002).
Heikman, et al., "Mass Transport Regrowth of GaN for Ohmic Contacts to AlGaN/GaN," *Applied Physics Letters*. vol. 78, No. 19, pp. 2876.
Heikman et al. "Polarization Effects in AlGaN/GaN and GaN/AlGaN/GaN heterostructures," *Journal of Applied Physics*. vol. 93, No. 12, pp. 10114-10118 (Jun. 2003).
Heikman, Sten J., *MOCVD Growth Technologies for Applications in AlGaN/GaN High Electron Mobility Transistors*, Dissertation, University of California—Santa Barbara, Sep. 2002, 190 pages.
Hikita et al., "350V/150A AlGaN/GaN Power HFET on Silicon Substrate With Source-via Grouding (SVG) Structure," *Electron Devices Meeting*, 2004, pp. 803-806, IEDM Technical Digest. IEEE International (Dec. 2004).
Kanaev et al., "Femtosecond and Ultraviolet Laser Irradiation of Graphitelike Hexagonal Boron Nitride," *Journal of Applied Physics*, 96(8), pp. 4483-4489 (Oct. 15, 2004).
Kanamura et al., "A 100-W High-Gain AlGaN/GaN HEMT Power Amplifier on a Conductive N-SiC Substrate for Wireless Base Station Applications," *Electron Devices Meeting*, 2004, pp. 799-802, IEDM Technical Digest. IEEE International (Dec. 2004).
Karmalkar et al. "Enhancement of Breakdown Voltage in AlGaN/GaN High Electron Mobility Transistors Using a Field Plate," *IEEE Transactions on Electron Devices*. vol. 48, No. 8, pp. 1515-1521 (Aug. 2001).
Karmalkar et al. "Resurf AlGaN/GaN HEMT for High Voltage Power Switching," *IEEE Electron Device Letters*. vol. 22, No. 8, pp. 373-375 (Aug. 2001).
Karmalkar et al., "Very High Voltage AlGaN/GaN High Electron Mobility Transistors Using a Field Plate Deposited on a Stepped Insulator," *Solid State Electronics*, vol. 45, pp. 1645-1652 (2001).
Kasahara et al., "Ka-ban 2.3W Power AlGaN/GaN Heterojunction FET," *IEDM Technical Digest*, pp. 677-680 (2002).
Komiak et al., "Fully Monolithic 4 Watt High Efficiency Ka-band Power Amplifier," *IEEE MTT-S International Microwave Symposium Digest*, vol. 3, pp. 947-950 (1999).
Küsters et al., "Double-Heterojunction Lattice-Matched and Pseudomorphic InGaAs HEMT with δ-Doped InP Supply Layers and p-InP Barier Enhancement Layer Grown by LP-MOVPE," *IEEE Electron Device Letters*, 14(1), (Jan. 1993).
Kuzmik et al, "Annealing of Schottky contacts deposited on dry etched AlGaN/Gan," *Semiconductor Science and Technology*. vol. 17, No. 11 (Nov. 2002).
Manfra et al., "Electron Mobility Exceeding 160 000 $cm^2/V$ s in AlGaN/GaN Heterostructures Grown by Molecular-beam Epitaxy," *Applied Physics Letters*, 85(22), pp. 5394-5396 (Nov. 29, 2004).
Manfra et al., "High Mobility AlGaN/GaN Heterostructures Grown by Plasma-assisted Molecular beam epitaxy on Semi-Insulating GaN Templates Prepared by Hydride Vapor Phase Epitaxy," *Journal of Applied Physics*, 92(1), pp. 338-345 (Jul. 1, 2002).
Manfra et al., "High-Mobility AlGaN/GaN Heterostructures Grown by Molecular-beam Epitaxy on GaN Templates Prepared by Hydride Vapor Phase Epitaxy," *Applied Physics Letters*, 77(18), pp. 2888-2890 (Oct. 30, 2000).
Neuburger et al. "Design of GaN-based Field Effect Transistor Structures based on Doping Screening of Polarization Fields," WA 1.5, $7^{th}$ Wide-Gandgap III-Nitride Workshop (Mar. 2002).
Parikh et al., "Development of Gallium Nitride Epitaxy and Associated Material-Device Correlation for RF, Microwave and MM-wave Applications," Cree, Inc. (35 slides).
Ping et al. "DC and Microwave Performance of High-Current AlGaN/GaN Heterostructure Field Effect Transistors Grown on p-Type SiC Substrates," *IEEE Electron Device Letters*. vol. 19, No. 2, pp. 54-56 (Feb. 1998).
Saxler et al., "III-Nitride Heterostructures on High-Purity Semi-Insulating 4H-SiC Substrates for High-Power RF Transistors," International Workshop on Nitride Semiconductors (Jul. 19, 2004).
Sheppard et al. "High Power Demonstration at 10 GHz with GaN/AlGaN HEMT Hybrid Amplifiers." Presented at the $58^{th}$ DRC, Denver, CO, Jun. 2000.
Sheppard et al. "Improved 10-GHz Operation of GaN/AlGaN HEMTs on Silicon Carbide," *Materials Science Forum*. vols. 338-342, pp. 1643-1646, (2000).
Shen et al., "High-Power Polarization-Engineered GaN/AlGaN/GaN HEMTs Without Surface Passivation," *IEEE Electronics Device Letters*. vol. 25, No. 1, pp. 7-9 (2004).
Shiojima et al., "Improved Carrier Confinement by a Buried p-Layer in the AlGaN/GaN HEMT Structure," *IEICE Trans. Electron.*, E83-C(12), (Dec. 2000).
Sriram et al. "RF Performance of AlGaN/GaN MODFET's on High Resistivity Sic Substrates," Presentation at Materials Research Society Fall Symposium, 1997.
Sriram et al. "SIC and GaN Wide Bandgap Microwave Power Transistors," *IEEE Samoff Symposium*, Pittsburgh, PA, Mar. 18, 1998.
Sullivan et al. "High-Power 10-GHz Operation of AlGaN HFET's on Insulating SiC," *IEEE Electron Device Letters*. vol. 19, No. 6, pp. 198-200 (Jun. 1998).
"Thick AIN template on SiC substrate—Novel semi insulating substrate for GaN-based devices," © 2003 by TDI, Inc., http://www.tdii.com/products/AIN_SiCT.html.
Tilak et al., "Influence of Barrier Thickness on the High-Power Performance of AlGaN/GaN HEMTs," *IEEE Electron Device Letters*, 22(11), pp. 504-506 (Nov. 2001).
United States Patent Application entitled "Improved Dielectric Passivation for Semiconductor Devices," U.S. Appl. No. 10/851,507, filed May 22, 2004.

(56) References Cited

OTHER PUBLICATIONS

United States Patent Application entitled "Nitride-Based Transistors and Methods of Fabrication Thereof Using Non-Etched Contact Recesses," U.S. Appl. No. 10/617,843, filed Jul. 11, 2003.
United States Patent Application entitled "Nitride-Based Transistors with a Protective Layer and a Low-Damage Recess and Methods of Fabrication Thereof," U.S. Appl. No. 10/758,871, filed Jan. 16, 2004.
United States Patent Application entitled "Co-Doping for Fermi Level Control in Semi-Insulating Group III Nitrides," U.S. Appl. No. 10/752,970, filed Jan. 7, 2004.
United States Patent Application entitled "Cap Layers and/or Passivation Layers for Nitride-Based Transistors, Transistor Structures and Methods of Fabricating the Same," U.S. Appl. No. 10/996,249, filed Nov. 23, 2004.
United States Patent Application entitled "Methods of Having Laterally Grown Active Region and Methods of Fabricating Same," U.S. Appl. No. 10/899,215, filed Jul. 26, 2004.
United States Patent Application entitled "Silicon Carbide on Diamond Substrates and Related Devices and Methods," U.S. Appl. No. 10/707,898, filed Jan. 22, 2004.
United States Patent Application entitled "Nitride Heterojunction Transistors Having Charge-Transfer Induced Energy Barriers and Methods of Fabricating the Same," U.S. Appl. No. 10/772,882, filed Feb. 5, 2004.
United States Patent Application entitled "Methods of Fabricating Nitride-Based Transistors with a Cap Layer and a Recessed Gate," U.S. Appl. No. 10/897,726, filed Jul. 23, 2004.
United States Patent Application entitled "Semiconductor Devices Having a Hybrid Channel Layer Current Aperture Transistors and Methods of Fabricating Same" U.S. Appl. No. 10/849,589, filed May 20, 2004.
United States Patent Application entitled "Methods of Fabricating Nitride-Based Transistors Having Regrown Ohmic Contact Regions and Nitride-Based Transistors Having Regrown Ohmic Contact Regions," U.S. Appl. No. 10/849,617, filed May 20, 2004.
United States Patent Application entitled "High Power Density and/or Linearity Transistors," U.S. Appl. No. 11/005,107, filed Dec. 6, 2004.
United States Patent Application entitled "Field Effect Transistors (FETS) Having Multi-Watt Output Power at Millimeter-Wave Frequencies," U.S. Appl. No. 11/005,423, filed Dec. 6, 2004.
United States Patent Application entitled "Group III Nitride Field Effect Transistors (FETs) Capable of Withstanding High Temperature Reverse Bias Test Conditions," U.S. Appl. No. 11/080,905, filed Mar. 15, 2005.
United States Patent Application entitled "Aluminum Free Group III-Nitride Based High Electron Mobility Transistors and Methods of Fabricating Same," U.S. Appl. No. 11/118,575, filed Apr. 29, 2005.
United States Patent Application entitled "Binary Group III-Nitride Based High Electron Mobility Transistors and Methods of Fabricating Same," U.S. Appl. No. 11/118,675, filed Apr. 29, 2005.
United States Patent Application entitled "Composite Substrates of Conductive and Insulating or Semi-Insulating Group III-Nitrides for Group III-Nitride Devices," U.S. Appl. No. 11/103,127, filed Apr. 11, 2005.
Vaudo et al., "GaN Boule Growth: A Pathway to GaN Wafers With Improved Material Quality," ATMI, Inc. (2003).
Walker, J. L. B. (Ed.), *High Power GaAs FET Amplifiers*, Norwood, MA: Artech House, pp. 119-120 (1993).
Wu et al., "3.5-Watt AlGaN/GaN HEMTs and Amplifiers at 35 GHz," IEDM-2003, Cree, Inc.
Wu et al., "3.5-Watt AlGaN/GaN HEMTs and Amplifiers at 35 GHz," Cree Santa Barbara Technology Center, Goleta, CA 93117.
Wu et al., "30-W/mm GaN HEMTs by Field Plate Optimization," *IEEE Electron Device Letters*, 25(3), pp. 117-119 (Mar. 2004).
Wu et al., "Bias-dependent Performance of High-Power AlGaN/GaN HEMTs," *IEDM Technical Digest*, p. 378-380 (2001).
Wu et al. "High Al-Content AlGaN/GaN MODFET's for Ultrahigh Performance," *IEEE Electron Device Letters*. vol. 19, No. 2, pp. 50-53 (Feb. 1998).
Wu et al., "Linearity Performance of GaN HEMTs With Field Plates," DRC 2004, Cree, Inc.
Wu et al., "Linearity Performance of GaN HEMTs With Field Plates," Cree Santa Barbara Technology Center, Goleta, CA 93117.
Xu et al., "Growth and Characteristics of Freestanding Gallium Nitride Substrates," ATMI, Inc. (2003).
Yu et al., "Schottky Barrier Engineering in III-V Nitrides via the Piezoelectric Effect," *Applied Physics Letters*, 73(13), pp. 1880-1882 (Sep. 28, 1998).
Zhang et al., "High Breakdown GaN HEMT with Overlapping Gate Structure," *IEEE Electron Device Letters*, 21(9), pp. 421-423 (Sep. 2000).
Annex to form PCT/ISA/206 Communication Relating to the Results of the Partial International Search for PCT/US2006/004353; Date of mailing Sep. 22, 2006.
Official Action, Japanese Patent Application No. 2008-506448, Feb. 1, 2012.
International Search Report and the Written Opinion of the International Searching Authority corresponding to International Application No. PCT/US2006/004353, mailed Dec. 4, 2006.
Official Action of the Intellectual Property Office, Taiwan Patent Application No. 095106153, Jul. 20, 2012.
Official Action, Japanese Patent Application No. 2008-506448, Sep. 21, 2012.
Official Action, Japanese Patent Application No. 2008-506448, May 24, 2013.

\* cited by examiner

METHODS OF FABRICATING THICK SEMI-INSULATING OR INSULATING EPITAXIAL GALLIUM NITRIDE LAYERS

STATEMENT OF GOVERNMENT INTEREST

The present invention was developed with Government support under contract number N00014-02-C-0306 awarded by the United States Navy. The Government has certain rights in this invention.

This application is a divisional application of U.S. application Ser. No. 11/103,117, filed Apr. 11, 2005, now U.S. Pat. No. 8,575,651, the contents of which are hereby incorporated herein by reference.

FIELD

The present invention relates to semiconductor devices and, more particularly, to Group III-Nitride semiconductor devices.

BACKGROUND

Materials such as silicon (Si) and gallium arsenide (GaAs) have found wide application in semiconductor devices for radio frequency (RF) applications. However, these, more familiar, semiconductor materials may not be well suited for higher power because of their relatively small bandgaps (e.g., 1.12 eV for Si and 1.42 for GaAs at room temperature) and/or relatively small breakdown voltages.

In light of the difficulties presented by Si and GaAs, interest in high power and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths than gallium arsenide (GaN) and GaN typically has better electron transport properties than silicon.

A device of particular interest for high power and/or high frequency applications is the High Electron Mobility Transistor (HEMT), which, in certain cases where doping is provided, is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of for example, $10^{13}$ carriers/cm$^2$. Unlike electrons in conventional bulk-doped devices, electrons in 2DEG may have higher mobilities due to reduced ion impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system can generate large amounts of RF power because of the combination of material characteristics that includes the aforementioned high breakdown fields, their wide bandgaps, large conduction band offset, and/or high saturated electron drift velocity. A major portion of the electrons in the 2DEG is attributed to polarization in the AlGaN.

HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

Conventional Group III-nitride HEMTs have been fabricated using heteroepitaxial growth; for example, HEMTs grown on SiC, sapphire, AlN or Si substrates. A HEMT grown on a thick AlN layer deposited by hydride vapor phase epitaxy (HVPE) on n-type SiC has been described. However, the growth of a thick AlN layer may require two different growth steps in two different reactors, one for growing the AlN layer and one for growing the GaN-based HEMT layers on the AlN layer.

SUMMARY

Some embodiments of the present invention provide semiconductor device structures and methods of fabricating semiconductor devices structures that include a conductive semiconductor substrate and a semi-insulating or insulating GaN epitaxial layer on the semiconductor substrate. The semi-insulating or insulating GaN epitaxial layer has a thickness of at least about 4 μm.

In some embodiments, the GaN epitaxial layer has a thickness of at least about 8 μm and, in some embodiments, at least about 10 μm. The semiconductor substrate may comprise conductive SiC and/or GaN. The GaN epitaxial layer may have a resistivity of at least about $10^5$ Ω-cm.

In some embodiments of the present invention, the GaN epitaxial layer has an isolation voltage of at least about 50V and in further embodiments, the GaN epitaxial layer has an isolation voltage of at least about 100V.

Additional embodiments of the present invention include a GaN based semiconductor device on the GaN epitaxial layer. A via hole and corresponding via metal in the via hole that extends through layers of the GaN based semiconductor device and the GaN epitaxial layer may also be provided. In further embodiments, the substrate is an insulating or semi-insulating substrate and the via hole and via metal extend through the substrate. In other embodiments, the substrate comprises a conductive substrate, the via hole and via metal extend to the substrate and the via metal provides an ohmic contact to the substrate. A region of higher doping concentration may also be provided in the substrate beneath the via.

In further embodiments of the present invention, the substrate comprises a conductive substrate and the device structure further comprises a conductive buffer layer disposed between the substrate and the GaN epitaxial layer. The via hole and the via metal may extend to the conductive buffer layer and the via metal may provide an ohmic contact to the conductive buffer layer. An etch stop layer may also be disposed between the conductive buffer layer and the GaN epitaxial layer.

In particular embodiments of the present invention, the conductive buffer layer comprises a first conductive layer of a first conductivity type on the substrate and a second conductive layer of a second conductivity type, opposite the first conductivity type, on the first conductive layer and disposed between the first conductive layer and the GaN epitaxial layer.

The via hole and the via metal may extend through the second conductive layer to the first conductive layer.

In yet further embodiments of the present invention, the substrate comprises a conductive substrate and the device structure further comprises a two dimensional electron gas (2DEG) structure disposed between the substrate and the GaN epitaxial layer. The 2DEG structure may include multiple 2DEG layers.

In additional embodiments of the present invention, the GaN epitaxial layer is doped with a deep level transition metal dopant. The GaN epitaxial layer may be doped with Fe, Co, Mn, Cr, V and/or Ni. The concentration of the deep level transition metal dopant may be at least about $1 \times 10^{16}$ cm$^{-3}$.

Some embodiments of the present invention provide GaN semiconductor device structures and methods of fabricating GaN semiconductor device structures that include a semiconductor substrate, an insulating or semi-insulating GaN epitaxial layer on the semiconductor substrate having a thickness of at least 4 µm and a conductive semiconductor layer disposed between the semiconductor substrate and the insulating or semi-insulating GaN epitaxial layer.

In further embodiments, the GaN epitaxial layer has a thickness of at least about 8 µm and, in some embodiments, a thickness of at least about 10 µm. The semiconductor substrate may be an insulating or semi-insulating semiconductor substrate. In some embodiments, the substrate comprises silicon carbide and/or sapphire. In other embodiments, the substrate comprises diamond. In some embodiments, the semiconductor substrate comprises an electrically conductive substrate. The electrically conductive substrate may comprise silicon carbide and/or diamond.

In further embodiments of the present invention, the conductive semiconductor layer comprises conductive SiC, conductive diamond, SiN and/or a conductive GaN based semiconductor material.

In additional embodiments of the present invention, a GaN based semiconductor device is provided on the GaN epitaxial layer. A via hole and corresponding via metal in the via hole may extend through layers of the GaN based semiconductor device and the GaN epitaxial layer. The via hole and via metal extend to the substrate and the via metal provides an ohmic contact to the substrate. In some embodiments, the via hole and the via metal extend to the conductive semiconductor layer and the via metal provides an ohmic contact to the conductive semiconductor layer.

In further embodiments, the conductive semiconductor layer comprises a first conductive layer of a first conductivity type on the substrate and a second conductive layer of a second conductivity type, opposite the first conductivity type, on the first conductive layer and disposed between the first conductive layer and the GaN epitaxial layer. The via hole and the via metal may extend through the second conductive layer to the first conductive layer.

In still further embodiments of the present invention, an etch stop layer is disposed between the conductive semiconductor layer and the GaN epitaxial layer.

Some embodiments of the present invention provide GaN semiconductor device structures and methods of fabricating GaN semiconductor device structures that include an electrically conductive SiC substrate and an insulating or semi-insulating GaN epitaxial layer on the conductive SiC substrate. The GaN epitaxial layer has a thickness of at least about 4 µm.

In some embodiments, the GaN based epitaxial layer has a thickness of at least about 8 µm and, in some embodiments, at least about 10 The GaN epitaxial layer may have a resistivity of at least about $10^5$ Ω-cm. The GaN epitaxial layer may have an isolation voltage of at least about 50V and, in some embodiments, at least about 100V.

In additional embodiments of the present invention, the GaN based epitaxial layer is doped with a deep level transition metal dopant. The GaN epitaxial layer may be doped with Fe, Co, Mn, Cr, V and/or Ni. The concentration of the deep level transition metal dopant may be at least about $1 \times 10^{16}$ cm$^{-3}$. In particular embodiments of the present invention, the GaN epitaxial layer is GaN doped with Fe.

In further embodiments of the present invention, the semiconductor device structure includes a conductive buffer layer disposed between the conductive SiC substrate and the GaN epitaxial layer. An etch stop layer may also be disposed between the conductive buffer layer and the GaN epitaxial layer. The conductive buffer layer may comprise an epitaxial SiC layer having a higher doping concentration than the SiC substrate. The conductive buffer layer may also comprise an implanted SiC layer in the SiC substrate that has a higher doping concentration than the SiC substrate.

In still further embodiments of the present invention, the semiconductor device structure includes a two dimensional electron gas (2DEG) structure disposed between the conductive substrate and the GaN epitaxial layer.

Additional embodiments of the present invention include a GaN based semiconductor device on the GaN epitaxial layer. The GaN based semiconductor device may be a GaN based high electron mobility transistor on the GaN epitaxial layer. A via hole and corresponding via metal in the via hole that extend through layers of the GaN based semiconductor device and the GaN epitaxial layer may also be provided. In some embodiments, the via hole and via metal extend through the SiC substrate. In other embodiments, the via hole and via metal extend to the substrate and the via metal provides an ohmic contact to the substrate. A region of higher doping concentration may also be provided in the substrate adjacent the via.

In further embodiments of the present invention, the semiconductor device structure includes a conductive buffer layer disposed between the substrate and the GaN epitaxial layer, the via hole and the via metal extend to the conductive buffer layer and the via metal provides an ohmic contact to the conductive buffer layer. An etch stop layer may be disposed between the conductive buffer layer and the GaN epitaxial layer. The etch stop layer may, for example, be AlN or AlGaN. The conductive buffer layer may comprise a first conductive layer of a first conductivity type on the substrate and a second conductive layer of a second conductivity type, opposite the first conductivity type, on the first conductive layer and disposed between the first conductive layer and the GaN epitaxial layer.

In additional embodiments of the present invention, the semiconductor device structure includes a two dimensional electron gas (2DEG) structure disposed between the substrate and the GaN epitaxial layer, the via hole and the via metal extend to the 2DEG structure and the via metal provides an ohmic contact to the 2DEG structure. An etch stop layer may be disposed between the 2DEG structure and the GaN epitaxial layer.

Some embodiments of the present invention provide GaN semiconductor device structures and methods of fabricating GaN semiconductor device structures that include an electrically conductive GaN substrate, an insulating or semi-insulating GaN epitaxial layer on the conductive GaN substrate, a GaN based semiconductor device on the GaN epitaxial layer and a via hole and corresponding via metal in the via hole that extend through layers of the GaN based semiconductor device and the GaN epitaxial layer.

In some embodiments of the present invention, the GaN based epitaxial layer has a thickness of at about least 4 μm. In some embodiments, the GaN based epitaxial layer has a thickness of at about least 8 μm and, in some embodiments, at least about 10 μm. The GaN epitaxial layer may have a resistivity of at least $10^5$ Ω-cm. The GaN epitaxial layer may have an isolation voltage of at least about 50V and, in some embodiments, at least about 100V.

In particular embodiments of the present invention, the GaN based epitaxial layer is doped with a deep level transition metal dopant. The GaN epitaxial layer may be doped with Fe, Co, Mn, Cr, V and/or Ni. The concentration of the deep level transition metal dopant may be at least about $1 \times 10^{16}$ cm$^{-3}$.

In further embodiments of the present invention, a conductive buffer layer is disposed between the conductive GaN substrate and the GaN epitaxial layer. The via hole and the via metal extend to the conductive buffer layer and the via metal provides an ohmic contact to the conductive buffer layer. An etch stop layer may be disposed between the conductive buffer layer and the GaN epitaxial layer. The conductive buffer layer may comprise an epitaxial layer having a higher doping concentration than the GaN substrate. The conductive buffer layer may comprise an implanted layer in the GaN substrate having a higher doping concentration than the GaN substrate.

In additional embodiments of the present invention, the semiconductor device structure includes a two dimensional electron gas (2DEG) structure disposed between the conductive substrate and the GaN epitaxial layer, where the via hole and the via metal extend to the 2DEG structure and the via metal provides an ohmic contact to the 2DEG structure.

In further embodiments of the present invention, the semiconductor device structure further includes a GaN based high electron mobility transistor on the GaN epitaxial layer.

In additional embodiments of the present invention, the via hole and via metal extend through the GaN substrate. The via hole and via metal may also extend to the substrate and the via metal provide an ohmic contact to the substrate. A region of higher doping concentration may also be provided in the substrate beneath the via.

DETAILED DESCRIPTION OF EMBODIMENTS OF THE INVENTION

Figure 1:
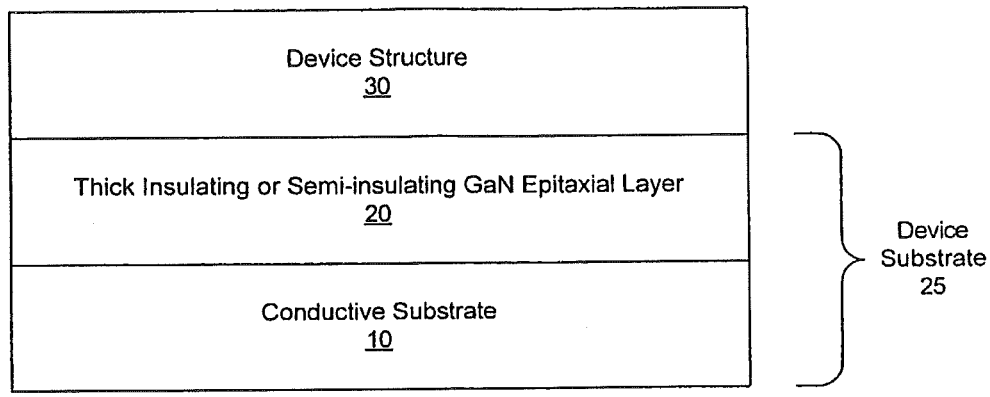
FIG. 1 is a cross-section of a semiconductor structure incorporating a thick semi-insulating or insulating GaN layer according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

Embodiments of the present invention may be particularly well suited for use in nitride-based devices such as Group III-nitride based HEMTs. As used herein, the term "Group III nitride" refers to those semiconductor compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

As illustrated in FIG. 1, embodiments of the present invention provide a thick GaN semi-insulating or insulating epitaxial layer 20 on an electrically conductive semiconductor substrate 10. The GaN semi-insulating or insulating epitaxial layer 20 has a thickness of at least about 4 µm, in some embodiments, at least about 8 µm and, in some embodiments at least about 10 µm. The conductive semiconductor substrate 10 and the semi-insulating or insulating epitaxial layer 20 provide a device substrate 25 on which a GaN based semiconductor device structure 30, such as a GaN based HEMT, is provided.

The electrically conductive substrate 10 may, in some embodiments, be a SiC, diamond, Si and/or GaN substrate. For example, in some embodiments of the present invention, the semiconductor substrate 10 may be a conductive SiC substrate, a conductive diamond substrate, a conductive Si substrate and/or a conductive GaN substrate. The conductive substrate 10 may be an n-type or p-type substrate. The substrate 10 may be a free-standing or boule grown substrate and may include, for example, a Group III nitride and/or GaN layers with a substrate of another material which may be removed. Methods of fabricating suitable substrates are known to those of skill in the art and need not be described in further detail herein. For example, if the substrate is a GaN substrate, the substrate may be fabricated as described in Xu et al., "Growth and Characteristics of Freestanding Gallium Nitride Substrates", ATMI, Inc., 2003; Vaudo et al., "GaN Boule Growth: A Pathway to GaN Wafers With Improved Material Quality," ATMI, Inc., 2003; and/or U.S. Pat. No. 6,765,240 entitled "BULK SINGLE CRYSTAL GALLIUM NITRIDE AND METHOD OF MAKING SAME," the disclosures of which are incorporated herein as if set forth in their entirety. SiC substrates are also commercially available. For example, SiC and GaN substrates are available from Cree, Inc. of Durham, N.C.

In some embodiments of the present invention, the GaN epitaxial layer 20 has a resistivity of at least $10^5$ Ω-cm. The GaN epitaxial layer may have an isolation voltage of at least about 50V, where the isolation voltage is measured as described below. In some embodiments of the present invention, the GaN epitaxial layer 20 has an isolation voltage of at least about 100V.

In some embodiments of the present invention, a buffer layer(s) (not shown) may be provided between the GaN semi-insulating or insulating epitaxial layer 20 and the conductive substrate 10. For example, where the GaN semi-insulating or insulating epitaxial layer 20 is formed on a non-GaN substrate by hetero-epitaxial growth, an AlN, AlGaN or other buffer layer may be provided. The buffer layer(s) may be of uniform or non-uniform composition. Thus, for example, a graded AlGaN layer may be provided as a buffer layer. The buffer layer(s) may also include, for example, a nucleation layer, such as a continuous or discontinuous AlN layer. Suitable buffer layers and their fabrication are described, for example, in U.S. Pat. No. 6,841,001, entitled "STRAIN COMPENSATED SEMICONDUCTOR STRUCTURES AND METHODS OF FABRICATING STRAIN COMPENSATED SEMICONDUCTOR STRUCTURES," the disclosure of which is incorporated herein as if set forth in its entirety.

The GaN semi-insulating or insulating epitaxial layer 20 may be formed on the conductive substrate 10 by techniques known to those of skill in the art. For example, metal organic vapor phase epitaxy (MOVPE) may be utilized. Suitable source materials for the semi-insulating or insulating epitaxial layer 20 include, for example, trimethylgallium (TMGa), $NH_3$ and $Cp_2Fe$. If the substrate 10 is a GaN substrate, the GaN semi-insulating or insulating epitaxial layer 20 may be formed as described in concurrently filed U.S. patent application Ser. No. 11/103,127 entitled "COMPOSITE SUBSTRATES OF CONDUCTIVE AND INSULATING OR SEMI-INSULATING GROUP III NITRIDES FOR GROUP III NITRIDE DEVICES" and/or U.S. patent application Ser. No. 10/752,970, filed Jan. 7, 2004 and entitled "CO-DOPING FOR FERMI LEVEL CONTROL IN SEMI-INSULATING GROUP III NITRIDES," the disclosures of which are incorporated herein as if set forth in its entirety.

The GaN semi-insulating or insulating epitaxial layer 20 may have deep level impurities, such as Fe, Co, Mn, Cr, V and/or Ni, and/or other point defects incorporated therein to make the epitaxial layer 20 semi-insulating or insulating. In particular embodiments of the present invention, the GaN epitaxial layer 20 is doped with Fe. For example, in some embodiments of the present invention, a dopant concentration of $1 \times 10^{18}$ cm$^{-3}$ may be provided. Furthermore, additional dopants may also be incorporated in the epitaxial layer 20. For example, if the composition of the epitaxial layer 20 differs from that of the conductive substrate 10, polarization-induced charge may result from the compositional differences. Such polarization-induced charge may be counteracted by doping the epitaxial layer 20 to maintain the insulating behavior of the epitaxial layer 20.

Figure 2:
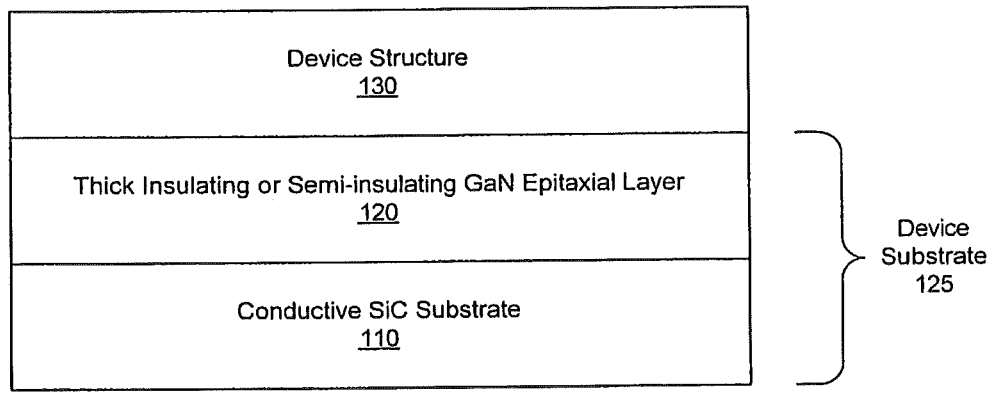
FIG. 2 is a cross-section of a semiconductor structure incorporating a thick semi-insulating or insulating GaN layer and a conductive SiC substrate according to further embodiments of the present invention.

FIG. 2 illustrates further embodiments of the present invention where a GaN semi-insulating or insulating epitaxial layer 120 is provided on a conductive SiC substrate 110. The GaN semi-insulating or insulating epitaxial layer 120 has a thickness of at least about 4 µm, in some embodiments at least about 8 µm or greater and, in some embodiments, at least about 10 µm. The conductive SiC substrate 110 and the semi-insulating or insulating epitaxial layer 120 provide a device substrate 125 on which a GaN based semiconductor device structure 130, such as a GaN based transistor structure, is provided. The thermal conductivity of SiC may be advantageous in extracting heat from such device structures formed on the substrate 110 and the thermal conductivity of conductive SiC may be higher than that of semi-insulating SiC.

While the SiC substrate 110 is illustrated as a single substrate, the substrate 110 may be provided by a SiC layer on another material, such as diamond. In particular embodiments, a conductive SiC substrate may be provided on a conductive diamond substrate. Such composite substrates may be provided as described, for example, in U.S. patent application Ser. No. 10/707,898, filed Jan. 22, 2004, entitled "SILICON CARBIDE ON DIAMOND SUBSTRATES AND RELATED DEVICES AND METHODS," the disclosure of which is incorporated herein as if set forth in its entirety. Conductive diamond may be more thermally conductive than semi-insulating diamond as selection of the growth parameters may be less constrained. For example, conductive diamond layers on conductive SiC substrates or conductive SiC layers on conductive diamond substrates may be provided as the composite substrate. Thus, in some embodiments of the present invention, the SiC substrate may be provided by a composite SiC substrate as described herein.

In some embodiments of the present invention, a buffer layer(s) (not shown) may be provided between the GaN semi-insulating or insulating epitaxial layer 120 and the conductive SiC substrate 110. For example, an AlN or other buffer layer(s) may be provided. Suitable buffer layers and their fabrication are described, for example, in U.S. Pat. No. 6,841,001 as discussed above.

The substrate 110 may be an n-type or p-type substrate. Electrically conductive SiC substrates may be easier and/or less expensive to produce in larger sizes and/or with higher structural quality than semi-insulating or insulating substrates. Methods of fabricating electrically conductive SiC substrates are known to those of skill in the art and need not be described further herein. Suitable SiC substrates are available from Cree, Inc., Durham, N.C.

The GaN semi-insulating or insulating epitaxial layer 120 may be formed on the substrate 110 by techniques known to those of skill in the art. For example, metal organic vapor phase epitaxy (MOVPE) may be utilized. Suitable source materials for the GaN semi-insulating or insulating epitaxial layer 120 include, for example, trimethylgallium (TMGa), NH$_3$ and Cp$_2$Fe. Because the substrate 110 may be conductive it may provide a higher quality (e.g. reduced defect density) substrate for the semi-insulating or insulating epitaxial layer 120.

The semi-insulating or insulating epitaxial layer 120 may have deep level impurities, such as Fe, Co, Mn, Cr, V and/or Ni, and/or other point defects incorporated therein to make the epitaxial layer 120 semi-insulating or insulating. In particular embodiments of the present invention, the GaN epitaxial layer 120 is doped with Fe. For example, in some embodiments of the present invention, a dopant concentration of $1 \times 10^{18}$ cm$^{-3}$ may be provided. Furthermore, additional dopants may also be incorporated in the epitaxial layer 120. Because the composition of the epitaxial layer 120 differs from that of the substrate 110 or buffer layer(s) if present, polarization-induced charge may result from the compositional differences. Such polarization-induced charge may be counteracted by doping the epitaxial layer 120 to maintain the insulating behavior of the epitaxial layer 120.

Figure 3:
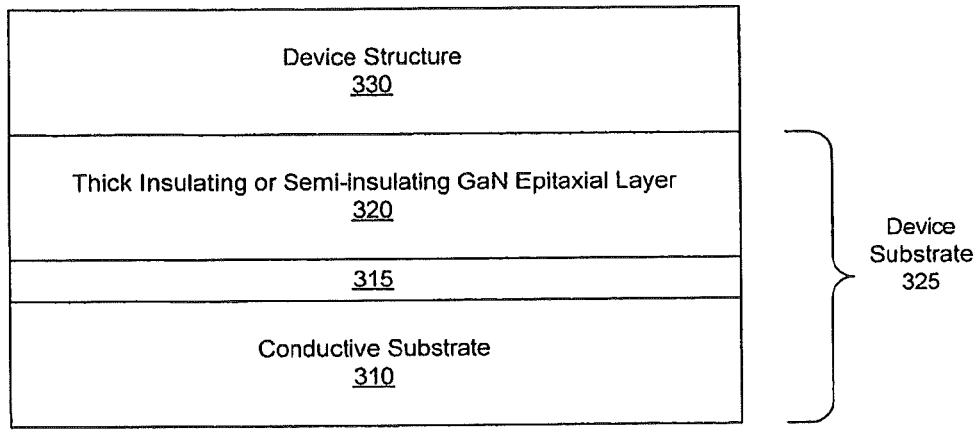
FIG. 3 is a cross-section of a semiconductor structure incorporating a thick semi-insulating or insulating GaN layer with a conductive buffer layer on a conductive substrate according to further embodiments of the present invention.

FIG. 3 illustrates further embodiments of the present invention where a conductive buffer layer 315 is provided between a conductive substrate 310 and a semi-insulating or insulating GaN epitaxial layer 320. The GaN semi-insulating or insulating epitaxial layer 320 may, in some embodiments, have a thickness of at least about 4 µm, in some embodiments at least about 8 µm and, in some embodiments, at least about 10 µm. The semiconductor substrate 310 and the semi-insulating or insulating epitaxial layer 320 provide a device substrate 325 on which a GaN based semiconductor device structure 330, such as a GaN based HEMT, is provided.

In some embodiments of the present invention, a buffer layer(s) (not shown) may be provided between the GaN semi-insulating or insulating epitaxial layer 320 and the conductive buffer layer 315. Optionally, a buffer layer (not shown) could be provided between the conductive substrate 310 and the conductive buffer layer 315. For example, an AlN, AlGaN or other buffer layer may be provided. The buffer layer(s) may be of uniform or non-uniform composition. Thus, for example, a graded AlGaN layer may be provided as a buffer layer. The buffer layer(s) may also include, for example, a nucleation layer, such as a continuous or discontinuous AlN layer. Suitable buffer layers and their fabrication are described, for example, in U.S. Pat. No. 6,841,001 as discussed above.

The substrate 310 may, in some embodiments, be a conductive SiC substrate, a conductive GaN substrate, a conductive diamond substrate or a conductive Si substrate. The substrate 310 may also be a composite substrate of SiC and diamond. The substrate 310 may be an n-type or p-type substrate. The substrate 310 may be a free-standing or boule grown substrate and may include, for example, a Group III nitride and/or GaN layers with a substrate of another material which may be removed. In the case of SiC and diamond, the diamond would not be removed. SiC/diamond substrates may be provided, for example, as described in U.S. patent application Ser. No. 10/707,898, discussed above. Methods of fabricating suitable substrates are known to those of skill in the art and need not be described in further detail herein.

The conductive buffer layer 315 may, for example, be an epitaxial layer on the substrate 310 or may be an implanted region in the substrate 310. In some embodiments of the present invention, ion implantation of dopant into the substrate 310 and annealing could also be used to provide the conductive buffer layer 315, which may help form ohmic contacts to the substrate 310. Such ion implantation and/or annealing could be carried out before formation of the epitaxial layer 320.

The conductive buffer layer 315 may have the same composition as the substrate 310 or may have a different composition. For example, if the substrate 310 is a SiC substrate, the conductive buffer layer 315 could be a SiC epitaxial layer or implanted region or the conductive buffer layer 315 could be a conductive GaN epitaxial layer, GaN dots and/or a conductive AlGaN layer. The conductive buffer layer 315 may have the same conductivity type as the substrate 310 or may be of opposite conductivity type. In some embodiments of the present invention, the conductive buffer layer 315 has a higher doping concentration than is present in the substrate 310. Furthermore, a higher dopant concentration buffer layer 315 may provide for a higher quality ohmic contact and/or a lower thermal treatment to provide an ohmic contact to the buffer layer 315 and, through the buffer layer 315, to the substrate 310.

The conductive buffer layer 315 may also include multiple layers. For example, the conductive buffer layer 315 may provide a two dimensional electron gas (2DEG) structure. Multiple 2DEG structures could be grown near the substrate to enhance current spreading at the expense of vertical resistance. In some embodiments, thin AlGaN layers could be appropriately doped with Si or appropriately graded in Al composition so as to reduce or minimize the barrier to vertical conduction of electrons. Combinations of a conductive epitaxial layer and a 2DEG structure may also be provided.

The conductive buffer layer 315 could also be provided, for example, by a conductive GaN layer on a conductive AlGaN layer on implanted SiC. Other suitable techniques for making a conductive interface between GaN and SiC may also be used. Thus, the conductive buffer layer 315 may be provided as described, for example, in U.S. Patent Application Publication No. 2002/0008241 entitled "GROUP III NITRIDE PHOTONIC DEVICES ON SILICON CARBIDE SUBSTRATES WITH CONDUCTIVE BUFFER INTERLAYER STRUCTURE," the disclosure of which is incorporated herein as if set forth in its entirety.

As an example, in some embodiments of the present invention, the conductive buffer layer 315 may be an even more heavily n-type doped layer, an n++GaN layer may be epitaxially grown prior to, but preferably in the same run as, the semi-insulating layer 320 to act as an ohmic contact and/or current spreading layer. Thin epi layers may often be doped more heavily than thick substrates without significant defects in the crystal. In some embodiments, the n++ layer is grown as thick and as heavily doped as possible without introducing significant defects. A thicker n++ layer may better spread current with lower total resistance than the substrate alone. Furthermore, the thicker the n++ layer, the more easily low resistance ohmic contacts may be made to the n++ layer without requiring precise etch times. Small amounts of In may be incorporated to reduce the strain in heavily Si doped layers, reduce defects and allow more Si incorporation, and possibly serve as an indicator for when the etch should be stopped.

In some embodiments, the conductive buffer layer 315 may include conductive layers of opposite conductive type. For example, the conductive buffer lay 315 may include an n++GaN layer adjacent the substrate 310 and a p-type GaN layer on the n++ GaN layer opposite the substrate 310. Such an opposite conductivity type layer may serve as a higher barrier for electron injection into the semi-insulating or insulating GaN layer 320 from the substrate 310.

Figure 4:
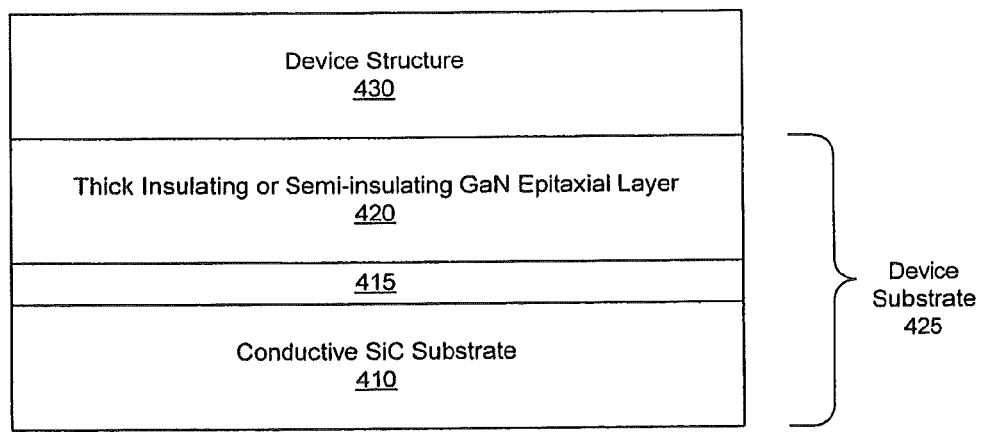
FIG. 4 is a cross-section of a semiconductor structure incorporating a thick semi-insulating or insulating GaN layer with a conductive buffer layer on a conductive SiC substrate according to further embodiments of the present invention.

FIG. 4 illustrates further embodiments of the present invention where a conductive buffer layer 415 is provided between a conductive SiC substrate 410 and a semi-insulating or insulating GaN epitaxial layer 420. The GaN semi-insulating or insulating epitaxial layer 420 may, in some embodiments, have a thickness of at least about 4 μm, in some embodiments at least about 8 μm and, in some embodiments, at least about 10 μm. The semiconductor substrate 410 and the semi-insulating or insulating epitaxial layer 420 provide a device substrate 425 on which a GaN based semiconductor device structure 430, such as a GaN based HEMT, is provided.

In some embodiments of the present invention, a buffer layer(s) (not shown) may be provided between the GaN semi-insulating or insulating epitaxial layer 420 and the conductive buffer layer 415. For example, an AlN, AlGaN or other buffer layer may be provided. The buffer layer(s) may be of uniform or non-uniform composition. Thus, for example, a graded AlGaN layer may be provided as a buffer layer. The buffer layer(s) may also include, for example, a nucleation layer, such as a continuous or discontinuous AlN layer. Suitable buffer layers and their fabrication are described, for example, in U.S. Pat. No. 6,841,001 as discussed above.

The conductive buffer layer 415 may, for example, be an epitaxial layer on the substrate 410, or may be an implanted region in the substrate 410. In some embodiments of the present invention, ion implantation of dopant into the substrate 410 and annealing could also be used to provide the conductive buffer layer 415, which may help form ohmic contacts to the substrate 410. Such ion implantation could be carried out before formation of the epitaxial layer 420. For example, ion implantation of a SiC substrate may be provided as described in U.S. Patent Application Publication No. 2004/0149993 entitled "METHODS OF TREATING A SILICON CARBIDE SUBSTRATE FOR IMPROVED EPITAXIAL DEPOSITION AND RESULTING STRUCTURES AND DEVICES" and/or U.S. Patent Application Publication No. 2005/0029526 entitled "METHODS OF TREATING A SILICON CARBIDE SUBSTRATE FOR IMPROVED EPITAXIAL DEPOSITION AND RESULTING STRUCTURES AND DEVICES," the disclosures of which are incorporated herein as if set forth in their entirety.

The conductive buffer layer 415 may have the same composition as the substrate 410, or may have a different composition. For example, the conductive buffer layer 415 could be a SiC epitaxial layer or implanted region or the conductive buffer layer 415 could be a conductive GaN epitaxial layer, GaN dots and/or a conductive AlGaN layer. The conductive buffer layer 415 may have the same conductivity type as the substrate 410 or may be of opposite conductivity type. In some embodiments of the present invention, the conductive buffer layer 415 has a higher doping concentration than is present in the substrate 410. Furthermore, a higher dopant concentration buffer layer 415 may provide for a higher quality ohmic contact and/or a lower thermal treatment to provide an ohmic contact to the buffer layer 415 and, through the buffer layer 415, to the substrate 410.

The conductive buffer layer 415 may also include multiple layers. For example, the conductive buffer layer 415 may provide a two dimensional electron gas (2DEG) structure. The 2DEG structure may include multiple 2DEG layers. For example, multiple 2DEG layers could be provided near the substrate to enhance current spreading at the expense of vertical resistance. In some embodiments, thin AlGaN layers could be heavily Si doped to increase the charge and reduce vertical resistance. Combinations of a conductive epitaxial layer and a 2DEG structure may also be provided.

As an example, in some embodiments of the present invention, the conductive buffer layer 415 may be an even more heavily n-type doped layer, an n++ SiC layer may be epitaxially grown prior to the semi-insulating layer 420 to act as an ohmic contact and/or current spreading layer. In some embodiments, the n++ layer is grown as thick and as heavily doped as possible without introducing significant defects. A thicker n++ layer may better spread current with lower total resistance than the substrate alone. Existence of a n++ current-spreading layer may slightly relax the high doping concentration requirements of the substrate, reducing costs. Furthermore, the thicker the n++ layer, the more easily low resistance ohmic contacts may be made to the n++ layer without requiring precise etch times.

In some embodiments, the conductive buffer layer 415 may include conductive layers of opposite conductive type. For example, the conductive buffer lay 415 may include an n++ SiC or GaN layer adjacent the substrate 410 and a p-type SiC or GaN layer on the n++ SiC or GaN layer opposite the substrate 410. Such an opposite conductivity type layer may serve as a higher barrier for electron injection into the semi-insulating or insulating GaN layer 420 from the substrate 410.

Fabrication of the GaN semi-insulating or insulating epitaxial layer 20, 120, 320 and/or 420 may be controlled to control the strain in the layer. For example, the III-V composition and/or the pressure under which the GaN semi-insulating or insulating epitaxial layer 20, 120, 320 and/or 420 is fabricated may be controlled to control the strain in the GaN semi-insulating or insulating epitaxial layer 20, 120, 320 and/or 420. By increasing the III-V ratio, the GaN semi-insulating or insulating epitaxial layer 20, 120, 320 and/or 420 may be made more compressive. Furthermore, by fabricating the GaN semi-insulating or insulating epitaxial layer 20, 120, 320 and/or 420 at lower pressures the GaN semi-insulating or insulating epitaxial layer 20, 120, 320 and/or 420 may be more compressive. Additionally, as the thickness of the GaN semi-insulating or insulating epitaxial layer 20, 120, 320 and/or 420 increases, an otherwise compressive strained layer may become tensile strained. Such tensile strain may result in defects, such as cracking, of the GaN semi-insulating or insulating epitaxial layer 20, 120, 320 and/or 420. Accordingly, the thickness, growth conditions and source materials may be controlled to avoid changes in the strain of the GaN semi-insulating or insulating epitaxial layer 20, 120, 320 and/or 420 during fabrication.

Control of the GaN/AlN nucleation conditions to control the initial strain through island growth and coalescence may also be used to control the strain of the GaN semi-insulating or insulating epitaxial layer 20, 120, 320 and/or 420. For example, the pressure and $NH_3$ flow rates may be adjusted to reduce and/or control strain and bow resulting from the growth of the GaN semi-insulating or insulating epitaxial layer 20, 120, 320 and/or 420.

Because a GaN based semiconductor device 30, 130, 330 and 430 is fabricated on the GaN semi-insulating or insulating epitaxial layer 20, 120, 320 and/or 420, GaN based semiconductor device 30, 130, 330 and 430 may be electrically isolated from the substrates 10, 110, 310 and 410. Furthermore, because GaN based semiconductor device 30, 130, 330 and 430 and the GaN semi-insulating or insulating epitaxial layer 20, 120, 320 and/or 420 are both GaN based structures, unlike an AlN isolation layer, the GaN based semiconductor device 30, 130, 330 and 430 and the GaN semi-insulating or insulating epitaxial layer 20, 120, 320 and/or 420 may be fabricated in a single step, using the same fabrication technique and/or in a single reactor. Furthermore, GaN may be grown faster than AlGaN or AlN by MOCVD. Thick GaN may also have a lower dislocation density than thick AlN grown under similar conditions (e.g., the same growth temperature).

In certain embodiments of the present invention, the GaN semi-insulating or insulating epitaxial layer 20, 120, 320 and/or 420 may be fabricated as follows. In the present example, the substrate is a SiC substrate and buffer layers between the substrate and insulating GaN may comprise one or a combination of the following: AlN, AlN graded to GaN, AlGaN, AlGaN graded to GaN, AlGaN/GaN/AlGaN superlattices, multiple layers of low-temperature GaN interlayers to terminate dislocations, multiple layers of micro-ELO through sparse-SiN or sparse-AlN to reduce dislocations, etc. The dislocation termination or reduction layers may be conductive, for example, sparse SiN may be n-type, and may provide the conductive layer on which the semi-insulating or insulating GaN layer is provided. Suitable GaN layers may be deposited by MOCVD (e.g., MOVPE/OMCVD/OMVPE) using TMGa, $NH_3$, and $Cp_2Fe$ as precursors. Semi-insulating GaN has been deposited on multiple wafers up to 100 mm in diameter at the same time using a growth pressure of 0.2 bar, a temperature of 1000° C., a V/III ratio of 250, a growth rate of 6 μm/hr and a Fe doping density of $2 \times 10^{18}$ $cm^{-3}$. A 30-200 nm AlN nucleation layer is deposited on a SiC substrate. The first part of the GaN layer is grown to control the strain primarily by adjusting the growth pressure and ammonia flow rate. For example, the pressure may be decreased to 0.1 bar to obtain a less tensile (more compressive) GaN film than that grown at 0.2 bar.

Semi-insulating GaN layers have been fabricated to thicknesses of about 30 μm on high purity SiC substrates with minimal cracking. In such a case, a thin, approximately 30 nm, layer of AlN was deposited using TMAl and $NH_3$ at low pressure. Then, 30 of GaN was deposited at 0.15 atmosphere using TMGa and $NH_3$ with a V/III ratio of 500. The layers were deposited at approximately 1000° C. The dislocation density was reduced to about $10^8$ $cm^{-2}$ for layers of this thickness.

As discussed above, the GaN epitaxial layer 20, 120, 320 and/or 420 is semi-insulating or insulating and the substrate 10, 110, 310, 410 is conductive. The terms "conductive," "semi-insulating" and "insulating" are understood by one of skill in the art and are used descriptively rather than in an absolute sense and, thus, are used to describe the relative conductivity/resistivity of the respective materials. In particular embodiments of the present invention, the semi-insulating or insulating epitaxial layer 20, 120, 320 and/or 420 has a resistivity equal to or higher than about $1 \times 10^5$ Ω-cm at room temperature and the conductive substrate 10, 110, 310, 410 has a resistivity of equal to or less than about 0.1 Ω-cm at room temperature.

In some embodiments of the present invention, a conductive substrate 10, 110, 310, 410 may have a resistivity of about 0.02 Ω-cm or less for reduced or minimal resistance when used as the ground to which via metal through the semi-insulating or insulating GaN layer 20, 120, 320, 420 is connected. Doping in the substrate 10, 110, 310, 410 may be n-type at a level of greater than about $1 \times 10^{18}$ $cm^{-3}$ and, in some embodiments a level of greater than about $1 \times 10^{19}$ $cm^{-3}$. The substrate 10, 110, 310, 410 may be doped as high as possible without increasing electrical resistance due to lower mobility or significantly impairing the crystal quality or thermal conductivity of the substrate. (As noted above, making the doping as high as possible in the conductive substrate may be relaxed somewhat, if there is an n++ current-spreading layer. This might make it cheaper and also better in terms of substrate defects to not require n++ 4H—SiC substrates.)

The epitaxial layer 20, 120, 320, 420 should be sufficiently insulating to provide electrical isolation of the device structure 30, 130, 330, 430 from the conductive substrate 10, 110, 310, 410. In particular embodiments, the epitaxial layer 20, 120, 320, 420 should be sufficiently insulating to provide electrical isolation of a source region from a drain region of a transistor, such as a HEMT, when a gate of the transistor is biased to pinch off the channel. Thus, the high field characteristics of the epitaxial layer 20, 120, 320, 420 may, in some embodiments of the present invention, be more determinative than the resistivity of the epitaxial layer 20, 120, 320, 420. Such high field characteristics may be characterized by the isolation voltage of the structure. Thus, in some embodiments of the present invention, the epitaxial layer 20, 120, 320, 420 is sufficiently insulating to provide an isolation voltage of at least 50 V and, in further embodiments of the present invention, the epitaxial layer is sufficiently insulating to provide an isolation voltage of at least 100 V. The isolation voltage refers to the voltage that provides a 1 mA/mm current for an ungated transistor structure on the epitaxial layer 20, 120, 320, 420. Thus, for example, the isolation voltage of a structure may be measured by forming a HEMT structure on the epitaxial layer 20, 120, 320, 420 with a 5 μm source to drain spacing and removing the gate from the structure. A 3-μm region, centered between source and drain, is damaged, for example, by ion implantation, or the channel is etched away, for example, by reactive ion etching (RIE), to destroy the channel region of the device. A voltage is then applied from the source to the drain and the current measured. The voltage at which 1 mA per mm of width of current flow is measured is referred to herein as the isolation voltage of the structure.

The thickness of the semi-insulating or insulating epitaxial layer 20, 120, 320, 420 may depend on the device that is formed on the semi-insulating or insulating epitaxial layer 20, 120, 320, 420 and the expected operating conditions for the device. For example, for a HEMT structure with an expected operating frequency of 2 GHz, a thickness of 5 μm may be suitable. For a HEMT structure with an expected operating frequency of 10 GHz, a thickness of 10 μm may be suitable. The particular thickness of the semi-insulating or insulating epitaxial layer 20, 120, 320, 420 may be controlled by the acceptable capacitance between the active device region and the underlying conductive substrate. Such capacitance may be affected by other layers between the device layers and a conductive layer. For example, if a non-conductive layer is provided between the semi-insulating or insulating epitaxial layer 20, 120, 320, 420, the thickness of the semi-insulating or insulating epitaxial layer 20, 120, 320, 420 may be adjusted based on the characteristics of the non-conductive layer, such as thickness and dielectric constant, to provide the acceptable capacitance.

In addition, because the substrate 10, 110, 310, 410 is conductive, the substrate 10, 110, 310, 410 may be used as a contact of the device structure 30, 130, 330, 430. Embodiments of the present invention incorporating via holes and via metal structures are illustrated in FIGS. 5 through 9.

In FIGS. 5 through 7 and 9, a conductive substrate 510 may be provided as described above with reference to FIGS. 1 through 4 with regard to the substrates 10, 110, 310 and 410. The substrate 810 may be conductive, semi-insulating or insulating. A semi-insulating or insulating GaN epitaxial layer 520 or 820 may be provided as described above with reference to the semi-insulating GaN epitaxial layers 20, 120, 320 and 420. Buffer layers may also be provided between the semi-insulating or insulating GaN epitaxial layers 520 or 820 and the substrates 510, 810 as described above. A device structure 530 is provided on the semi-insulating or insulating GaN epitaxial layers 520 or 820 and may be a device structure 30, 130, 330 or 430 as described above. As is further illustrated in FIG. 6, a conductive buffer layer 615 may be provided as described above with reference to the conductive buffer layers 315 and 415. Accordingly, these aspects of the embodiments illustrated in FIGS. 5 through 8 will not be described in further detail below.

Figure 5:
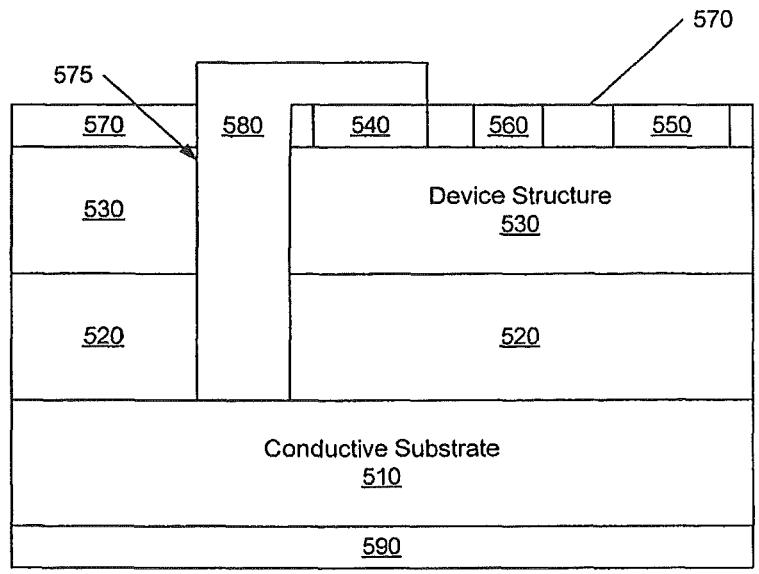
FIG. 5 is a cross-section of a semiconductor structure incorporating a via through a thick semi-insulating or insulating GaN layer on a conductive substrate according to further embodiments of the present invention.

As illustrated in FIG. 5, contacts 540, 550 and 560 may be provided for the semiconductor device 530. The contacts 540, 550 and 560 may, for example, be a source contact, a drain contact and a gate contact, respectively, for a GaN based transistor, such as a HEMT. While three contacts are illustrated in FIGS. 5 through 9, fewer or more contacts may be provided based on the semiconductor device provided. A passivation layer(s) 570, such as a SiN, $SiO_2$, oxynitride or other such layer, may also be provided on exposed surfaces of the semiconductor device structure 530 and/or portions of the metal contacts/overlayers. A backside ohmic contact 590 may also be provided to the substrate 510 opposite the face of the substrate 510 on which the semi-insulating or insulating GaN epitaxial layer 520 is provided. To improve the resistivity of the ohmic contact to the substrate 510, the backside of the substrate 510 may, for example, be implanted and annealed (not shown).

As is further illustrated in FIG. 5, a via hole 575 extends through the device structure 530 and the semi-insulating or insulating GaN epitaxial layer 520 to and/or into the conductive substrate 510. If non-conductive buffer layers are provided between the semi-insulating or insulating GaN epitaxial layer 520 and the conductive substrate 510, the via hole 575 should extend through the non-conductive layers to the conductive substrate.

In some embodiments, the passivation layer(s) 570 may provide an etch mask or a separate etch mask may be utilized for forming the via hole 575. For example, a thick photo resist may be used as a mask to protect the GaN based device structure 530. The via hole 575 may be formed, for example, by reactive ion etching (RIE) or inductively coupled plasma (ICP) with a plasma containing chlorine compounds, such as $Cl_2$, $BCl_3$, or other compounds.

A via metal 580 is provided in the via hole 575 and contacts the substrate 510. The via metal may be selected to provide an ohmic contact to the substrate 510. For example, if the substrate 510 is SiC, nickel or other suitable metal, may be used as the via metal 580. Other conductors, such as polysilicon and/or metal silicides may also be used as the via metal 580. Multiple materials may be used as the via metal 580. For example, the metal in direct contact with the substrate 510 or the conductive buffer layer 615 described below may be nickel while the remained of the metal may be gold. Accordingly, references to via metal refer to a conductor of one or more conductive materials within a via hole.

Figure 6:
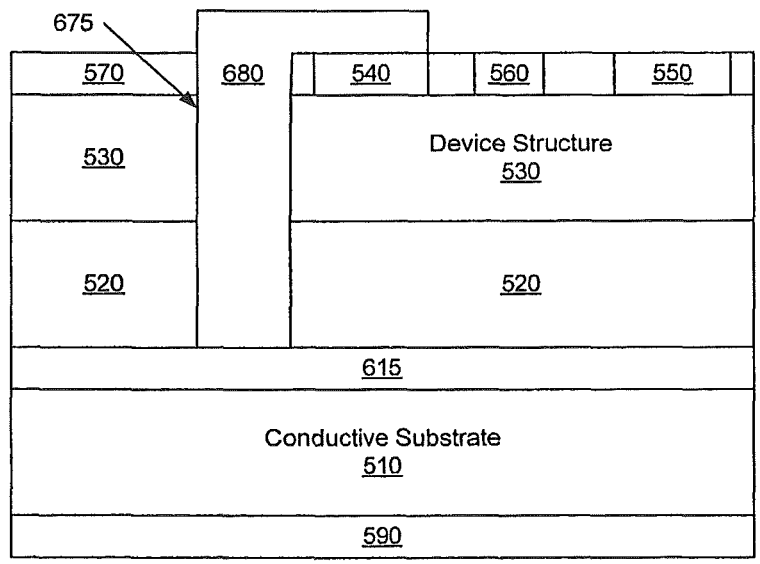
FIG. 6 is a cross-section of a semiconductor structure incorporating a via through a thick semi-insulating or insulating GaN layer with a conductive buffer layer on a conductive substrate according to further embodiments of the present invention.

FIG. 6 illustrates the inclusion of the conductive buffer layer 615 between the semi-insulating or insulating GaN epitaxial layer 520 to the conductive substrate 510. In some embodiments, the conductive buffer layer 615 is an implanted layer in the substrate 510 and/or a highly doped epitaxial layer on the substrate 510. As seen in FIG. 6, the via hole 675 extends through the device structure 530 and the semi-insulating or insulating GaN epitaxial layer 520 to and/or into the conductive buffer layer 615. If non-conductive buffer layers are provide between the semi-insulating or insulating GaN epitaxial layer 520 and the conductive buffer layer 615, the via hole 675 should extend through the non-conductive layers to the conductive buffer layer 615. The via metal 680 extends into the via hole 675 and contacts the conductive buffer layer 615. The via metal 680 may be selected to provide an ohmic contact to the conductive buffer layer 615. As discussed above, providing the conductive buffer layer may provide for a higher quality ohmic contact and may provide for current spreading to the substrate 510. In some embodiments, the conductive buffer layer 615 may act as an etch stop layer.

The via hole 675 may be etched as described above with respect to FIG. 5. However, because the RIE or ICP may have limited selectivity between the GaN epitaxial layer 520 and the conductive buffer layer 615, the conductive buffer layer 615 may, in some cases, be etched through to the substrate 510. Thus, in some embodiments of the present invention, the via hole 675 extends through the conductive buffer layer 615 to the substrate 510.

In embodiments of the present invention where the conductive buffer layer 615 includes conductive layers of opposite conductivity type, the via hole 675 may extend through the layer of opposite conductivity type to the substrate 510 and to or into the layer with the same conductivity type as the substrate 510. For example, if the substrate 510 is an n-type SiC substrate and the conductive buffer lay 615 includes an n++ SiC layer and a p-type SiC layer on the n++ SiC layer, the via hole 675 may extend through the p-type SiC layer and to or into the n++ SiC layer.

In some embodiments of the present invention the via hole 675 may extend through the conductive buffer layer 615 to the substrate 510. For example, if the conductive buffer layer 615 comprises a 2DEG structure, the via hole 675 and via metal 680 may extend through the 2DEG structure to the substrate 510.

Figure 7:
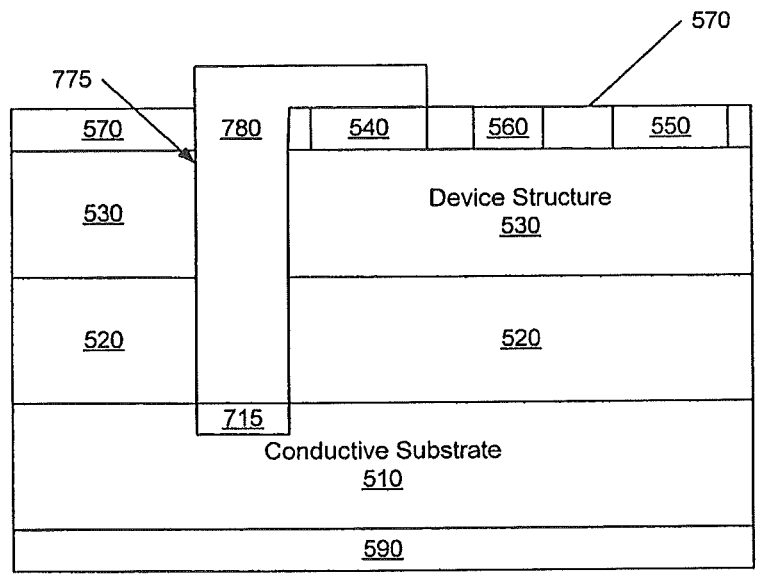
FIG. 7 is a cross-section of a semiconductor structure incorporating a via through a thick semi-insulating or insulating GaN layer to an implanted layer of a conductive substrate according to further embodiments of the present invention.

FIG. 7 illustrates the inclusion of a region 715 of higher dopant concentration in the substrate 510 where the region 715 is provided in the opening exposed by the via hole 775. Such a region may be provided, for example, by implanting dopant through the via hole 775 to provide an implanted region beneath or adjacent the via hole 775 and then activating the implanted dopant. As seen in FIG. 7, the via hole 775 extends through the device structure 530 and the semi-insulating or insulating GaN epitaxial layer 520 to and/or into the substrate 510. If non-conductive buffer layers are provided between the semi-insulating or insulating GaN epitaxial layer 520 and the substrate 510, the via hole 775 should extend through the non-conductive layers to the substrate 510. The via metal 780 extends into the via hole 775 and contacts the region 715. The via metal may be selected to provide an ohmic contact to the region 715. As discussed above, providing a region of higher dopant concentration may provide for a higher quality ohmic contact to the substrate 510. The via hole 775 may be etched as described above with respect to FIG. 5.

Figure 8:
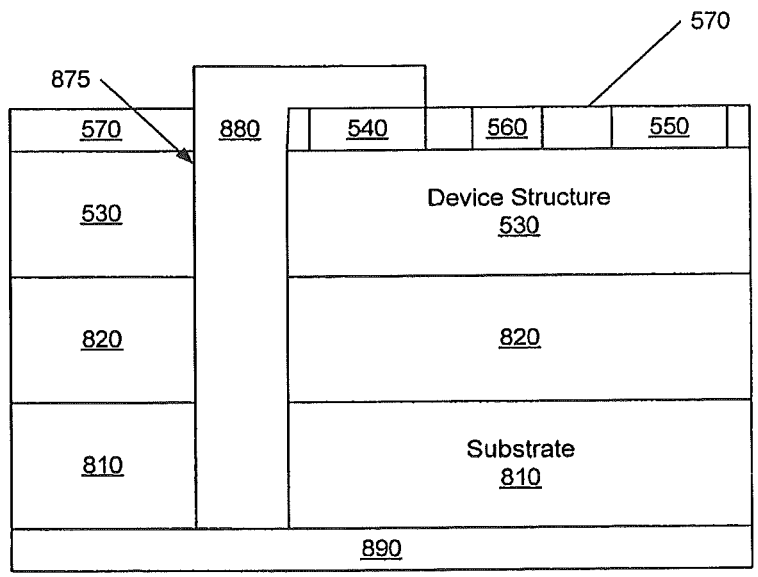
FIG. 8 is a cross-section of a semiconductor structure incorporating a via through a thick semi-insulating or insulating GaN layer and a semiconductor substrate according to further embodiments of the present invention.

FIG. 8 illustrates further embodiments of the present invention where the via hole 880 extends through the substrate 810 and the via metal 880 extends through the via hole 875 to contact a backside contact 890. The backside contact 890 is on a face of the substrate 810 opposite the semi-insulating or insulating GaN epitaxial layer 820. Techniques for fabricating such a via are described, for example, in U.S. Patent Application Publication No. US2004/0241970, published Dec. 4, 2004 and entitled "METHOD OF FORMING VIAS IN SILICON CARBIDE AND RESULTING DEVICES AND CIRCUITS," the disclosure of which is incorporated herein by reference as if set forth in its entirety.

Figure 9:
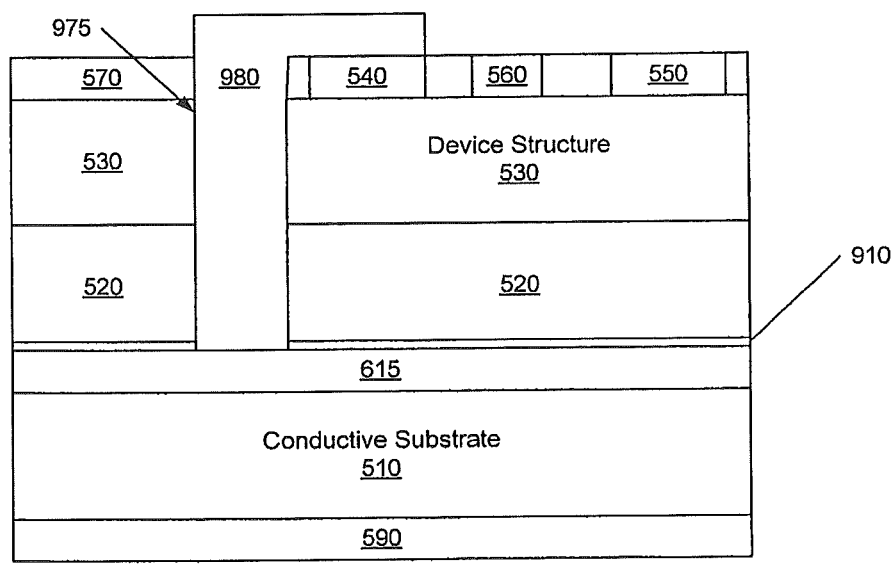
FIG. 9 is a cross-section of a semiconductor structure incorporating a via through a thick semi-insulating or insulating GaN layer and an etch stop layer according to further embodiments of the present invention.

In addition to the structures illustrated above with reference to FIGS. 1 through 4, an additional layer(s) may be included between the semi-insulating or insulating GaN epitaxial layer 520 and the substrate 510 that provide an etch stop for etching the via holes 575, 675 and 775 illustrated in FIGS. 5, 6 and 7. Such a structure is illustrated in FIG. 9. As seen in FIG. 9, an etch stop layer 910 is provided between the conductive buffer layer 615 and the semi-insulating or insulating epitaxial layer 520. The via hole 975 extends through the etch stop layer 910 and the via metal 985 extends through the etch stop layer 910 to contact the buffer layer 615. If the etch stop layer 910 is conductive, the via hole 975 and the via metal 985 may only extend to contact the etch stop layer 910.

For example, a thin AlN layer may be provided between the semi-insulating or insulating GaN epitaxial layer 520 and the substrate 510 or the conductive buffer layer 615 as the etch stop layer 910. In such a case, adding a fluorine-containing compound, such as $CF_4$, $NF_3$ and/or $SiF_4$ to the conventional chlorine-containing plasmas used for RIE or ICP of GaN and other Group III-N materials may result in a highly selective etch that will slow or stop at the AlN layer. In some embodiments, the thickness of an AlN nucleation layer may be adjusted to provide the etch stop layer 910. The nucleation layer may be thick enough to provide an etch stop but thin enough to be removed with a non-selective etch for AlN and SiC. If the AlN layer etch stop layer 910 is thin, it could be removed with a non-selective etch or, alternatively, it could be removed with a wet etch such as a strong base without etching through the buffer layer 615, If a non-selective etch is used, the thickness of the buffer layer 615 may be much greater than the thickness of the etch stop layer 910.

While the use of an etch stop layer 910 has been illustrated with respect to embodiments incorporating a conductive buffer layer 615, the etch stop layer 910 could be used without the presence of the buffer layer 615 to control the depth of etch into the substrate 510 or as a precursor to the implantation as illustrated in FIG. 7. Furthermore, if multiple layers of the same or different conductivity type are provided, an etch stop layer 910 could be provided between ones of the multiple layers. The implantation illustrated in FIG. 7 could be carried out with the etch stop layer present or removed. If the implantation is performed with the etch stop layer 910 present, the etch stop layer 910 could be removed prior to formation of the via metal 780.

By using vias through a GaN semi-insulating or insulating epitaxial layer to a conductive substrate, no wafer thinning may be needed. Thus, reduced warping and the thermal properties of the substrate may be maintained—also higher yield processes are available.

While each of the embodiments of the present invention described above utilize a conductive substrate, some embodiments of the present invention are not limited to the use of a conductive substrate. The isolation benefits of a thick semi-insulating or insulating GaN epitaxial layer may be provided where a conductive layer is present between the semi-insulating or insulating GaN epitaxial layer irrespective of whether the substrate itself is conductive. Such embodiments of the present invention are illustrated in FIGS. 10 and 11.

Figure 10:
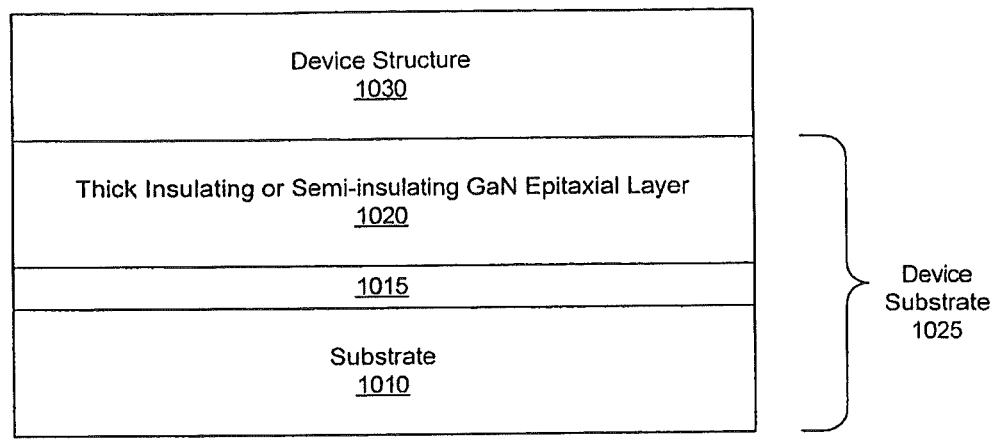
FIG. 10 is a cross-section of a semiconductor structure incorporating a thick semi-insulating or insulating GaN layer with a conductive layer according to further embodiments of the present invention.
Figure 11:
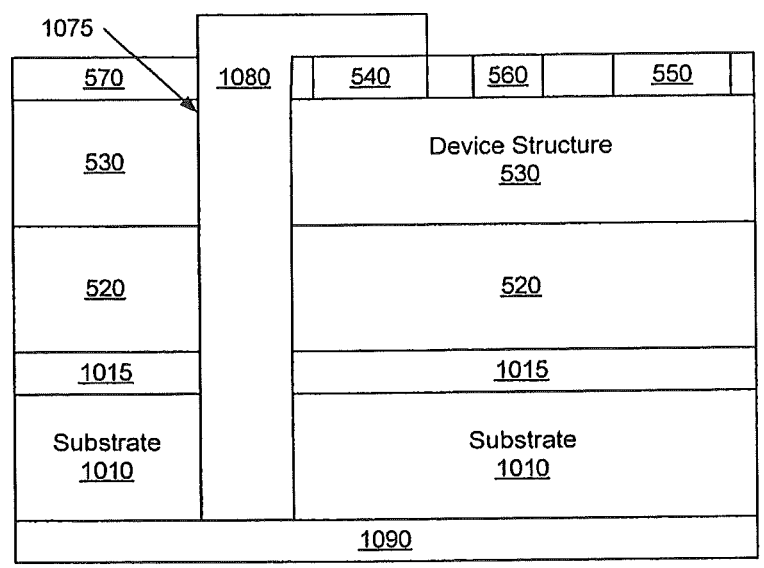
FIG. 11 is a cross-section of a semiconductor structure incorporating a via through a thick semi-insulating or insulating GaN layer on a conductive layer according to further embodiments of the present invention.

FIG. 10 illustrates further embodiments of the present invention where a conductive layer 1015 is provided between a substrate 1010 and a semi-insulating or insulating GaN epitaxial layer 1020. The GaN semi-insulating or insulating epitaxial layer 1020 may, in some embodiments, have a thickness of at least about 4 µm, in some embodiments at least about 8 µm and, in some embodiments, at least about 10 µm. The semiconductor substrate 1010 and the semi-insulating or insulating epitaxial layer 1020 provide a device substrate 1025 on which a GaN based semiconductor device structure 1030, such as a GaN based HEMT, is provided.

In some embodiments of the present invention, a buffer layer(s) (not shown) may be provided between the GaN semi-insulating or insulating epitaxial layer 1020 and the conductive layer 1015. Optionally, a buffer layer (not shown) could be provided between the substrate 1010 and the conductive layer 1015. For example, an AlN, AlGaN or other buffer layer may be provided. The buffer layer(s) may be of uniform or non-uniform composition. Thus, for example, a graded AlGaN layer may be provided as a buffer layer. The buffer layer(s) may also include, for example, a nucleation layer, such as a continuous or discontinuous AlN layer. Suitable buffer layers and their fabrication are described, for example, in U.S. Pat. No. 6,841,001 as discussed above.

The substrate 1010 may, in some embodiments, be a SiC substrate, a GaN substrate, a diamond substrate, an AlN substrate, a sapphire substrate or a Si substrate. The substrate 1010 may also be a composite substrate of SiC and diamond. The substrate 1010 may be semi-insulating or insulating. The substrate 1010 may be a free-standing or boule grown substrate and may include, for example, a Group III nitride and/or GaN layers with a substrate of another material which may be removed. In the case of SiC and diamond, the diamond would, typically not be removed. Thus, in some embodiments of the present invention, the conductive layer 1015 and the substrate 1010 may be provided as a conductive SiC layer on an insulating or semi-insulating diamond substrate or as an insulating or semi-insulating SiC layer on a conductive diamond substrate. SiC/diamond substrates may be provided, for example, as described in U.S. patent application Ser. No. 10/707,898, discussed above. Methods of fabricating suitable substrates are known to those of skill in the art and need not be described in further detail herein.

The conductive layer 1015 could also be provided by conductive GaN, AlGaN, AlGaN graded to GaN, AlGaN/GaN/AlGaN superlattices, multiple layers of low-temperature GaN interlayers to terminate dislocations, multiple layers of micro-ELO through sparse-SiN or sparse-AlN to reduce dislocations, etc. In particular embodiments of the present invention, the dislocation termination or reduction layers provide the conductive layer 1015. For example, sparse SiN may be n-type, and may provide the conductive layer 1015 on which the semi-insulating or insulating GaN layer is provided. In some embodiments of the present invention, a conductive layer 1015 is provided by an epitaxial lateral overgrowth (ELO) structure on a sapphire substrate. Other structures that provide a conductive layer may also be utilized. Furthermore, the conductive layer 1015 could be provided by multiple layers, possibly separated by semi-insulating or insulating layers.

Fabrication of the GaN semi-insulating or insulating epitaxial layer 1020 may be carried out as described above with reference to the GaN semi-insulating or insulating epitaxial layer 20, 120, 320 and/or 420.

Because a GaN based semiconductor device 1030 is fabricated on the GaN semi-insulating or insulating epitaxial layer 1020, the GaN based semiconductor device 1030 may be electrically isolated from the conductive layer 1015. Furthermore, because GaN based semiconductor device 1030 and the GaN semi-insulating or insulating epitaxial layer 1020 are both GaN based structures, unlike an AlN isolation layer, the GaN based semiconductor device 1030 and the GaN semi-insulating or insulating epitaxial layer 1020 may be fabricated in a single step and/or in a single reactor. Furthermore, as discussed above, GaN may be grown faster than AlGaN or AlN by MOCVD. Thick GaN may also have a lower dislocation density than thick AlN grown under similar conditions (e.g., the same growth temperature).

In particular embodiments of the present invention, the semi-insulating or insulating epitaxial layer 1020 has a resistivity equal to or higher than about $1 \times 10^5$ $\Omega$-cm at room temperature and the conductive layer 1015 has a resistivity of equal to or less than about 0.1 $\Omega$-cm at room temperature. In some embodiments of the present invention, conductive layer 1015 may have a resistivity of about 0.02 $\Omega$-cm or less. The epitaxial layer 1020 should be sufficiently insulating to provide electrical isolation of the device structure 1030 from the conductive layer 1015. In particular embodiments, the epitaxial layer 1020 should be sufficiently insulating to provide electrical isolation of a source region from a drain region of a transistor, such as a HEMT, when a gate of the transistor is biased to pinch off the channel as described above. Thus, in some embodiments of the present invention, the epitaxial layer 1020 is sufficiently insulating to provide an isolation voltage of at least 50 V and, in further embodiments of the present invention, the epitaxial layer is sufficiently insulating to provide an isolation voltage of at least 100 V.

Further embodiments of the present invention incorporating via hole and via metal structures are illustrated in FIG. 11. FIG. 11 illustrates a via hole 1075 and via metal 1080 that extend to through conductive layer 1015 between the semi-insulating or insulating GaN epitaxial layer 1020 and the substrate 1010. As seen in FIG. 11, the via hole 1075 and via metal 1080 extends through the device structure 1030, the semi-insulating or insulating GaN epitaxial layer 1020, the conductive layer 1015 and the substrate 1010 and contacts a backside contact 1090 is on a face of the substrate 1010 opposite the semi-insulating or insulating GaN epitaxial layer 1020. Techniques for fabricating such a via are described, for example, in U.S. Patent Application Publication No. US2004/0241970, published Dec. 4, 2004 and entitled "METHOD OF FORMING VIAS IN SILICON CARBIDE AND RESULTING DEVICES AND CIRCUITS," the disclosure of which is incorporated herein by reference as if set forth in its entirety.

In addition to the via structure of FIG. 11 or alternatively, the via structure of FIG. 6 could be used with the structure of FIG. 10. The conductive layer 1015 could by coupled to the backside contact by the via extending through the conductive layer 1015 or, alternatively or additionally, a via from the backside could be provided to the conductive layer 1015.

While some embodiments of the present invention are not limited to a particular GaN semiconductor device structure 30, 130, 330, 430, 530, 1030 in some embodiments of the present invention, the GaN semiconductor device structure 30, 130, 330, 430, 530, 1030 may be a GaN based transistor structure. For example, the GaN semiconductor device structure 30, 130, 330, 430, 530, 1030 may comprise a high electron mobility transistor (HEMT) structure. For example, some embodiments of the present invention may include transistor structures such as those described in commonly assigned U.S. Pat. No. 6,316,793 and U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. Pat. No. 6,849,882 to Smorchkova et al., entitled "GROUP-III NITRIDE BASED HIGH ELECTRON MOBILITY TRANSISTOR (HEMT) WITH BARRIER/SPACER LAYER", U.S. patent application Ser. No. 10/617,843 filed Jul. 11, 2003 for "NITRIDE-BASED TRANSISTORS AND METHODS OF FABRICATION THEREOF USING NON-ETCHED CONTACT RECESSES," U.S. patent application Ser. No. 10/772,882 filed Feb. 5, 2004 for "NITRIDE HETEROJUNCTION TRANSISTORS HAVING CHARGE-TRANSFER INDUCED ENERGY BARRIERS AND METHODS OF FABRICATING THE SAME," U.S. patent application Ser. No. 10/897,726, filed Jul. 23, 2004 entitled "METHODS OF FABRICATING NITRIDE-BASED TRANSISTORS WITH A CAP LAYER AND A RECESSED GATE," U.S. patent application Ser. No. 10/849,617, filed May 20, 2004 entitled "METHODS OF FABRICATING NITRIDE-BASED TRANSISTORS HAVING REGROWN OHMIC CONTACT REGIONS AND NITRIDE-BASED TRANSISTORS HAVING REGROWN OHMIC CONTACT REGIONS," U.S. patent application Ser. No. 10/849,589, filed May 20, 2004 and entitled "SEMICONDUCTOR DEVICES HAVING A HYBRID CHANNEL LAYER, CURRENT APERTURE TRANSISTORS AND METHODS OF FABRICATING SAME," U.S. Patent Publication No. 2003/0020092 filed Jul. 23, 2002 and published Jan. 30, 2003 for "INSULATING GATE ALGAN/GAN HEMT", U.S. patent application Ser. No. 10/996,249, filed Nov. 23, 2004 and entitled "CAP LAYERS AND/OR PASSIVATION LAYERS FOR NITRIDE-BASED TRANSISTORS, TRANSISTOR STRUCTURES AND METHODS OF FABRICATING SAME," U.S. patent application Ser. No. 11/080,905, filed Mar. 15, 2005 and entitled "GROUP III NITRIDE FIELD EFFECT TRANSISTORS (FETs) CAPABLE OF WITHSTANDING HIGH TEMPERATURE REVERSE BIAS TEST CONDITIONS," U.S. patent application Ser. No. 11/005,107, filed Dec. 6, 2004 and entitled "HIGH POWER DENSITY AND/OR LINEARITY TRANSISTORS," and U.S. patent application Ser. No. 11/005,423, filed Dec. 6, 2004 and entitled "FIELD EFFECT TRANSISTORS (FETs) HAVING MULTI-WATT OUTPUT POWER AT MILLIMETER-WAVE FREQUENCIES," the disclosures of which are incorporated herein as if described in their entirety. Embodiments of the present invention may also be utilized with HEMT structures such as described in, for example, Yu et al., "Schottky barrier engineering in III-V nitrides via the piezoelectric effect," Applied Physics Letters, Vol. 73, No. 13, 1998, or in U.S. Pat. No. 6,584,333 filed Jul. 12, 2001, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," the disclosures of which are incorporated herein by reference as if set forth fully herein.

While various exemplary embodiments of the present invention have been described with reference to FIGS. 1 through 11, combinations and/or sub-combinations of the features and elements illustrated in the figures may also be provided. Thus, for example, an etch stop layer illustrated with FIG. 9 may be provided in the embodiments of the present invention illustrated in FIGS. 1 through 8, 10 and 11.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

1. A method of fabricating a semiconductor device structure, comprising:
epitaxially forming a semi-insulating or insulating GaN epitaxial layer on a conductive semiconductor substrate, the semi-insulating or insulating GaN epitaxial layer having a thickness of at least about 4 μm;
forming a conductive buffer layer disposed between the substrate and the GaN epitaxial layer;
providing a backside contact on a surface of the conductive substrate, opposite the insulating or semi-insulating GaN epitaxial layer; and
forming a via hole and corresponding via metal in the via hole that extends through the conductive substrate and exposes a portion of the backside contact, wherein forming the via metal comprises forming the via metal that contacts the backside contact at the exposed portion through the conductive substrate.

2. The method of claim 1, wherein the GaN epitaxial layer has a thickness of at least about 8 μm.

3. The method of claim 1, wherein the GaN epitaxial layer has a thickness of at least about 10 μm.

4. The method of claim 1, wherein the GaN epitaxial layer has a resistivity of at least $10^5$ Ω-cm.

5. The method of claim 1, further comprising forming a GaN based semiconductor device on the GaN epitaxial layer.

6. The method of claim 5, wherein GaN based layers of the semiconductor device and the GaN epitaxial layer are formed by the same fabrication technique.

7. The method of claim 5, wherein the via hole and via metal extend to the substrate and wherein the via metal provides an ohmic contact to the substrate.

8. The method of claim 5, further comprising forming a region of higher doping concentration in the substrate beneath the via.

9. The method of claim 8, further comprising forming a two dimensional electron gas structure (2DEG) disposed between the substrate and the GaN epitaxial layer.

10. The method of claim 5, wherein the via hole and the via metal extend to the conductive buffer layer and wherein the via metal provides an ohmic contact to the conductive buffer layer.

11. The method of claim 10, further comprising forming an etch stop layer disposed between the conductive buffer layer and the GaN epitaxial layer.

12. The method of claim 10, wherein forming a conductive buffer layer comprises:
forming a first conductive layer of a first conductivity type on the substrate; and
forming a second conductive layer of a second conductivity type, opposite the first conductivity type, on the first conductive layer and disposed between the first conductive layer and the GaN epitaxial layer; and
wherein the via hole and the via metal extend through the second conductive layer to the first conductive layer.

13. The method of claim 1, wherein the GaN epitaxial layer is doped with a deep level transition metal dopant.

14. The method of claim 13, wherein the GaN epitaxial layer is doped with Fe, Co, Mn, Cr, V and/or Ni.

15. The method of claim 14, wherein the concentration of the deep level transition metal dopant is at least about $1 \times 10^{16}$ cm$^{-3}$.

16. The method of claim 1, wherein the substrate comprises silicon.

17. A method of fabricating a GaN semiconductor device structure, comprising:
epitaxially forming an insulating or semi-insulating GaN epitaxial layer on a semiconductor substrate, the GaN epitaxial layer having a thickness of at least 4 μm;
forming a conductive semiconductor layer disposed between the semiconductor substrate and the insulating or semi-insulating GaN epitaxial layer;
providing a backside contact on a surface of the semiconductor substrate, opposite the insulating or semi-insulating GaN epitaxial layer; and
forming a via hole and corresponding via metal in the via hole that extends through the semiconductor substrate and exposes a portion of the backside contact, wherein forming the via metal comprises forming the via metal that contacts the backside contact at the exposed portion through the semiconductor substrate.

18. The method of claim 17, wherein the semiconductor substrate comprises an insulating or semi-insulating semiconductor substrate.

19. The method of claim 17, wherein the substrate comprises silicon carbide and/or sapphire.

20. The method of claim 18, wherein the substrate comprises diamond.

21. The method of claim 17, wherein the semiconductor substrate comprises an electrically conductive substrate.

22. The method of claim 21, wherein the electrically conductive substrate comprises silicon carbide and/or diamond.

23. The method of claim 17, wherein the substrate comprises silicon.

24. A method of fabricating a GaN semiconductor device structure, comprising:
   epitaxially forming an insulating or semi-insulating GaN epitaxial layer on a conductive SiC substrate, the GaN epitaxial layer having a thickness of at least 4 µm; and
   forming a conductive buffer layer disposed between the conductive SiC substrate and the GaN epitaxial layer, wherein forming a conductive buffer layer comprises:
      forming a first conductive layer of a first conductivity type on the substrate; and
      forming a second conductive layer of a second conductivity type, opposite the first conductivity type, on the first conductive layer and disposed between the first conductive layer and the GaN epitaxial layer.

25. The method of claim 24, wherein the GaN epitaxial layer has a resistivity of at least about $10^5$ Ω-cm.

26. The method of claim 24, wherein the GaN based epitaxial layer is doped with a deep level transition metal dopant.

27. The method of claim 26, wherein the GaN epitaxial layer is doped with Fe, Co, Mn, Cr, V and/or Ni.

28. The method of claim 26, wherein the concentration of the deep level transition metal dopant is at least about $1 \times 10^{16}$ cm$^{-3}$.

29. A method of fabricating a GaN semiconductor device structure, comprising:
   epitaxially forming an insulating or semi-insulating GaN epitaxial layer on a conductive GaN substrate;
   forming a GaN based semiconductor device on the GaN epitaxial layer;
   forming a via hole and corresponding via metal in the via hole that extends through layers of the GaN based semiconductor device and the GaN epitaxial layer; and
   providing a backside contact on a surface of the conductive GaN substrate, opposite the insulating or semi-insulating GaN epitaxial layer,
   wherein forming the via hole further comprises forming the via hole that extends through the conductive substrate and exposes a portion of the backside contact; and
   wherein forming the via metal comprises forming the via metal that contacts the backside contact at the exposed portion through the conductive substrate.

* * * * *